United States Patent
Yamasaki et al.

(10) Patent No.: US 6,683,007 B1
(45) Date of Patent: *Jan. 27, 2004

(54) ETCHING AND CLEANING METHODS AND ETCHING AND CLEANING APPARATUS USED THEREFOR

(75) Inventors: Shinya Yamasaki, Tokyo (JP); Hidemitsu Aoki, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/525,445

(22) Filed: Mar. 14, 2000

(30) Foreign Application Priority Data

Mar. 15, 1999 (JP) .............................. 11-068898

(51) Int. Cl.$^7$ .......................................... H01L 21/302
(52) U.S. Cl. ......................................... 438/745; 134/95
(58) Field of Search .................. 134/98, 147, 95; 156/345; 438/745

(56) References Cited

U.S. PATENT DOCUMENTS

| | | | |
|---|---|---|---|
| 5,032,217 A | | 7/1991 | Tanaka |
| 5,204,687 A | | 4/1993 | Elliott et al. |
| 5,520,205 A | * | 5/1996 | Guldi et al. ............... 134/98.1 |
| 5,546,094 A | | 8/1996 | Egashira |
| 5,779,816 A | * | 7/1998 | Trinh ......................... 134/23 |
| 5,801,662 A | | 9/1998 | Itoh |
| 5,861,066 A | | 1/1999 | Moinpour et al. |
| 6,063,232 A | * | 5/2000 | Terasawa et al. ........... 156/345 |
| 6,155,275 A | * | 12/2000 | Shinbara ..................... 134/61 |
| 6,202,658 B1 | * | 3/2001 | Fishkin et al. ............... 134/147 |
| 6,260,562 B1 | * | 7/2001 | Morinishi et al. ......... 134/57 R |
| 6,299,697 B1 | * | 10/2001 | Nishibe et al. ................ 134/3 |
| 6,494,221 B1 | * | 12/2002 | Sellmer et al. ............ 134/147 |

FOREIGN PATENT DOCUMENTS

| | | |
|---|---|---|
| EP | 0 368 334 | 5/1990 |
| EP | 0516490 | 12/1992 |
| EP | 0736925 | 10/1996 |
| EP | 0814536 | 12/1997 |
| EP | 0 924 754 | 6/1999 |
| JP | 62-264626 | 11/1987 |
| JP | 01-259536 | 10/1989 |
| JP | 02-197126 | 8/1990 |
| JP | 2-197126 | 8/1990 |
| JP | 2-309638 | 12/1990 |
| JP | 04-340226 | 11/1992 |
| JP | 05-226808 | 9/1993 |
| JP | 06-224170 | 8/1994 |
| JP | 63-22665 | 11/1994 |
| JP | 8-78378 | 3/1996 |
| JP | 08-78378 | 3/1996 |
| JP | 8-236435 | 9/1996 |
| JP | 08-323303 | 12/1996 |
| JP | 8-323303 | 12/1996 |
| JP | 09186519 | 7/1997 |
| JP | 09-260331 | 10/1997 |

(List continued on next page.)

Primary Examiner—Kin-Chan Chen
(74) Attorney, Agent, or Firm—Sughrue Mion, PLLC

(57) ABSTRACT

An etching/cleaning method makes it possible to effectively remove unnecessary materials on a semiconductor wafer, having a surface peripheral area and a surface device area, without damaging the device area. The semiconductor is rotated in a horizontal plane while an etching/cleaning liquid is emitted by an edge nozzle toward the surface peripheral area, thereby selectively etching an unnecessary material in the surface peripheral area. The etching/cleaning liquid emitted from the edge nozzle preferably has an emission direction oriented along a rotation direction of the wafer or outward with respect to a tangent of the wafer formed near a contact point of the liquid with the surface peripheral area of the wafer.

28 Claims, 17 Drawing Sheets

FOREIGN PATENT DOCUMENTS

| | | |
|---|---|---|
| JP | 09-275087 | 10/1997 |
| JP | 09-293715 | 11/1997 |
| JP | 10-79334 | 3/1998 |
| JP | 10-242114 | 9/1998 |
| TW | 290707 | 11/1996 |
| TW | 333165 | 5/1998 |
| WO | WO 99/22419 | 5/1999 |
| WO | WO 99/46064 | 9/1999 |

* cited by examiner

US 6,683,007 B1

ETCHING AND CLEANING METHODS AND ETCHING AND CLEANING APPARATUS USED THEREFOR

BACKGROUND OF THE INVENTION

1. Field of the Invention

The present invention relates to etching and cleaning methods and etching and cleaning apparatuses used for semiconductor device fabrication and more particularly, to etching and cleaning methods of removing an unnecessary or undesired material or materials from a semiconductor wafer and etching and cleaning apparatuses used for performing the etching or cleaning method.

2. Description of the Prior Art

In the processes of fabricating semiconductor devices on a semiconductor wafer, various etching methods are usually used to remove unnecessary or undesired materials from the wafer and various cleaning methods are usually used to clean contaminants attached to the wafer or devices. In these cases, there is the need to remove unnecessary or undesired materials existing on the surface peripheral area of the wafer, on the back peripheral area of the wafer, or on the end face of the wafer.

Here, the "end face" means the end face of the wafer located between its surface and back and approximately perpendicular to them. The "surface peripheral area" means the area or region of the surface of the wafer between the device area and the end face. The device area is an area or region of the surface of the wafer in which desired semiconductor devices are formed. The "back peripheral area" means the area or region of the back of the wafer in which an undesired or unnecessary material or materials to be removed are present.

In recent years, copper (Cu) has been used as a wiring or interconnection material instead of aluminum (Al), because Cu is higher in conductivity than Al. In this case, Cu wiring lines are typically formed in trenches of a silicon dioxide ($SiO_2$) film, which are usually realized by the step of forming the trenches in the $SiO_2$ film, the step of forming a Cu film on the $SiO_2$ film to cover the trenches by electroplating, and the step of selectively removing the Cu film to leave the same in the trenches by Chemical Mechanical Polishing (CMP). This method is termed the "damascene process".

Next, the damascene process for the Cu wiring lines is explained in detail.

First, trenches are formed in a $SiO_2$ film to have a pattern for desired wiring lines by a known method, where the $SiO_2$ film is formed on or over a single-crystal silicon (Si) wafer or substrate. Second, a barrier metal film, which is made of meal such as tantalum (Ta) and tantalum nitride (TaN), is formed on the $SiO_2$ film to cover the trenches by sputtering. The barrier metal film is to prevent the Cu atoms from diffusing into the $SiO_2$ film. Third, a seed Cu film is formed on the barrier metal film by sputtering. Fourth, a wiring Cu film is formed on the seed Cu film by electroplating.

In the fourth step of forming the wiring Cu film by electroplating, a ring-shaped blocking member is placed on the surface of the wafer to surround the device area and then, a proper plating liquid or solution is supplied to the inside of the member. At this time, there is a possibility that the plating liquid leaks out of the member. If leakage of the liquid occurs, the wiring Cu film is formed not only in the device area but also in the surface peripheral area of the wafer. The wiring Cu film thus formed in the surface peripheral area is unnecessary and to be removed. The unnecessary Cu film tends to be detached from the $SiO_2$ film in the subsequent process or processes due to stress to thereby contaminate the production lines of the semiconductor device, because of weak adhesion of the plated Cu film to the $SiO_2$ film. As a result, the unnecessary Cu film needs to be removed.

Moreover, after the CMP process is completed, the Si wafer is contaminated by Cu wastes produced from the Cu film polished. The Cu wastes tend to diffuse into the $SiO_2$ film and the Si wafer due to subsequent heat treatment, thereby badly affecting the performance of the semiconductor devices formed in the device area. Since the Cu wastes adhere onto the surface and back peripheral areas and the end face of the wafer, they are difficult to be removed therefrom. Thus, the Cu wastes need to be removed by cleaning.

When the Si wafer is 8 inches in diameter, the distance between the edge of the device area and the end face of the wafer is typically set as, for example, approximately 5 mm. To expand the device area, it is preferred that the $SiO_2$ film (in which the Cu wiring lines are formed) is formed on the wafer to be expanded until the distance between the edge of the $SiO_2$ film and the end face is decreased to 1.5 mm to 2.0 mm. In this case, however, when the seed Cu film is deposited onto the barrier metal film over the whole wafer by sputtering in order to cover the whole $SiO_2$ film, it tends to cover not only the device area but also the surface and back peripheral areas and the end face of the wafer. Thus, if the plating liquid or solution supplied to the inside of the ring-shaped blocking member leaks out, the wiring Cu film tends to be formed on the seed film not only in the device area but also in the surface and back peripheral areas and the end face.

Since the wiring Cu film is formed on the seed Cu film, it is not separated or stripped off. However, the wiring Cu film existing on the end face of the wafer tends to be adhered onto the wafer carriers and/or the robot arms during transportation processes in the semiconductor device fabrication system. Thus, it tends to contaminate the transportation subsystem. This means that the wiring Cu film existing on the surface and back peripheral areas and the end face of the wafer needs to be removed before the wafer is transported to the next stage.

Furthermore, the removal of the above-described wiring Cu film requires good controllability. This is because the distance between the edge of the $SiO_2$ film and the end face is as short as 1.5 mm to 2 mm. The cleaning of the above-described Cu contaminants generated in the CMP process also necessitates similar good controllability.

To remove the undesired or unnecessary Cu film or contaminants explained above, various etching and cleaning methods have been developed and disclosed, two examples of which are shown in FIGS. 1 and 2.

In the prior-art cleaning/etching method as shown in FIG. 1, a protection film 112 having an etch-resistant property is selectively formed on the surface 110A of a semiconductor wafer 110 to cover the entire device area formed thereon. Then, the wafer 110 with the film 112 is entirely immersed into an etching solution 114 stored in a suitable container 113, thereby etching selectively the exposed area of the wafer 110. Thus, the exposed area is cleaned. Thereafter, the film 112 is removed from the wafer 110.

As the etching solution 114, for example, a mixture of hydrogen fluoride (HF), hydrogen peroxide ($H_2O_2$), and water ($H_2O$), which is often termed "Fluoric-Peroxide Mixture (FPM)", may be used.

In the prior-art cleaning/etching method as shown in FIG. 2, a semiconductor wafer 110 is rotated in a horizontal plane by a proper rotating means while it is turned upside down. In this state, an etching solution 114 (e.g., FPM) is supplied downward toward the center of the back 110B of the wafer 110. At the same time as this, a protection gas 115 (e.g., nitrogen gas, $N_2$) is supplied upward toward the center of the surface 110A of the wafer 110.

The solution 114 thus supplied onto the back 110B moves outward to the end face 110C of the wafer 110 along the back 110B and then, flows along the vertical end face 110C, and drops from the end face 110C. Part of the solution 114 reaches the periphery of the surface 110A and then, it is dropped therefrom.

The protection gas 115 thus supplied to the surface 110A keeps the device area not to be contacted with the etching solution 114. The solution 114 selectively etches the back 110B, the end face 110C, and the periphery of the surface 110A, thereby cleaning them.

With the prior-art cleaning/etching method as shown in FIG. 1, there is a disadvantage that some contrivance is required for the protection film 112 not to be formed in the periphery of the surface 110A of the wafer 110. Also, it is essential that the semiconductor devices and wiring lines formed in the device area are not damaged by removal of the protection film 112 form the surface 110A. However, this is difficult to be realized. If the protection film 112 is made of a resist material, the number of the necessary process steps is increased.

With the prior-art cleaning/etching method as shown in FIG. 2, the flow of the etching solution 114 toward the back 110B of the wafer 110 is controlled by the rotation speed of the wafer 110 and the flow rate of the protection gas 115 toward the surface 110A. Thus, the controllability is low.

Furthermore, the circular edge of the flowing solution 114, which is defined by contact or collision of the solution 114 with the gas 115 and extends along the edge of the wafer 110, tends to wave or fluctuate. As a result, the solution 114 may reach the device area at some location to etch the same. Alternately, the solution 114 does not contact with the periphery of the surface 110A at some location, leaving the undesired material thereon.

As a result, the prior-art cleaning/etching method shown in FIG. 2 is unable to be applied to the case where the distance between the edge of the device area and the end face of the wafer is as short as 1.5 mm to 2.0 mm.

SUMMARY OF THE INVENTION

Accordingly, an object of the present invention is to provide an etching method and an etching apparatus that make it possible to effectively remove an unnecessary material or materials existing on a semiconductor wafer without damaging the device area.

Another object of the present invention is to provide an etching method and an etching apparatus that make it possible to effectively remove an unnecessary material or materials existing on a semiconductor wafer with good controllability.

Still another object of the present invention is to provide an etching method and an etching apparatus that removes effectively an unnecessary material or materials existing on a semiconductor wafer even if the distance between the edge of the device area and the end face of the wafer is as short as approximately 1.5 mm to 2.0 mm.

A further object of the present invention is to provide a cleaning method and a cleaning apparatus that make it possible to effectively clean a semiconductor wafer without damaging the device area.

A still further object of the present invention is to provide a cleaning method and a cleaning apparatus that make it possible to effectively clean a semiconductor wafer with good controllability.

A still further object of the present invention is to provide a cleaning method and a cleaning apparatus that cleans effectively a semiconductor wafer even if the distance between the edge of the device area and the end face of the wafer is as short as approximately 1.5 mm to 2.0 mm.

The above objects together with others not specifically mentioned will become clear to those skilled in the art from the following description.

According to a first aspect of the present invention, an etching apparatus is provided, which is comprised of:
(a) a rotating means for holding a semiconductor wafer and for rotating the wafer in a horizontal plane;
 the wafer having a device area and a surface peripheral area on its surface;
 the surface peripheral area being located outside the device area; and
(b) an edge nozzle for emitting an etching liquid toward a surface peripheral area of the wafer.

The etching liquid emitted from the edge nozzle selectively etches out an unnecessary material existing in the surface peripheral area of the wafer.

With the etching apparatus according to the first aspect of the present invention, the edge nozzle emits the etching liquid toward the surface peripheral area of the wafer while rotating the wafer in a horizontal plane. Thus, the etching liquid emitted to the surface peripheral area does not move inward due to a centrifugal force generated by rotation of the wafer. As a result, the unnecessary material existing in the surface peripheral area of the wafer is effectively removed without damaging the device area of the wafer.

Moreover, the emission of the etching liquid is controlled by the rotation speed of the wafer and the flow rate of the liquid and therefore, the etching action can be carried out with good controllability. This means that even if the distance between the edge of the device area and the end face of the wafer is as short as approximately 1.5 mm to 2.0 mm, the unnecessary material existing on the wafer can be removed effectively.

In a preferred embodiment of the etching apparatus according to the first aspect of the invention, the etching liquid emitted from the edge nozzle has an emission direction oriented along a rotation direction of the wafer or outward with respect to a tangent of the wafer formed near a contact point of the liquid with the surface peripheral area of the wafer.

In another preferred embodiment of the etching apparatus according to the first aspect of the invention, a back nozzle is additionally provided. The back nozzle emits an etching liquid toward a back center of the wafer. The etching liquid emitted from the back nozzle etches out an unnecessary material existing on a back of the wafer. In this embodiment, there is an additional advantage that not only the unnecessary material existing in the surface peripheral area of the wafer but also that existing on the back of the wafer can be removed simultaneously.

In still another preferred embodiment of the etching apparatus according to the first aspect of the invention, a surface nozzle is additionally provided. The surface nozzle emits a protecting liquid toward a surface center of the wafer. The protecting liquid emitted from the surface nozzle covers the device area of the wafer to protect the same against the etching liquid emitted from the edge nozzle. In this embodiment, there is an additional advantage that the device area can be prevented from being damaged due to the etching liquid emitted from the edge nozzle even if part of the etching liquid is jumped into the device area from the surface peripheral area.

In a further preferred embodiment of the etching apparatus according to the first aspect of the invention, a back nozzle and a surface nozzle are additionally provided. The back nozzle emits an etching liquid toward a back center of the wafer. The etching liquid emitted from the back nozzle etches out an unnecessary material existing on a back of the wafer. The surface nozzle emits a protecting liquid toward a surface center of the wafer. The protecting liquid emitted from the surface nozzle covers the device area of the wafer to protect the same against the etching liquid emitted from the edge nozzle.

In a still further preferred embodiment of the etching apparatus according to the first aspect of the invention, the etching liquid emitted from the edge nozzle is beam-shaped. In this embodiment, there is an additional advantage that the controllability is further improved.

The rotating means may be in any form if it can hold the semiconductor wafer and rotate it in a horizontal plane. However, it is preferred that the rotating means may be in any one of the following forms.

The rotating means may be of a roller-chucking type, in which the means comprises rollers arranged along an end face of the wafer. The rollers are contacted with the end face of the wafer to hold the wafer and rotated synchronously.

The rotating means may be of a pin-chucking type, in which the means comprises pins supported by a supporting member and arranged along an end face of the wafer. The pins are contacted with the end face of the wafer to hold the wafer and rotated synchronously by the member.

The rotating means may be of a pin-chucking type, in which the means comprises a first plurality of pins and a second plurality of pins supported by a supporting member. The first plurality of pins and the second plurality of pins are alternately arranged along an end face of the wafer. The first plurality of pins and the second plurality of pins are alternately contacted with the end face of the wafer to hold the wafer and rotated synchronously by the member.

The rotating means may be of a pin-chucking type, in which the means comprises a first plurality of pins and a second plurality of pins supported by a supporting member. The first plurality of pins are arranged along an end face of the wafer. The second plurality of pins are arranged along the end face of the wafer. The first plurality of pins are contacted with the end face of the wafer to hold the wafer and rotated synchronously by the member in a period. The second plurality of pins are contacted with the end face of the wafer to hold the wafer and rotated synchronously by the member in another period.

According to a second aspect of the present invention, a cleaning apparatus is provided, which is comprised of:
(a) a rotating means for holding a semiconductor wafer and for rotating the wafer in a horizontal plane;
the wafer having a device area and a surface peripheral area on its surface;
the surface peripheral area being located outside the device area; and
(b) an edge nozzle for emitting a cleaning liquid toward a surface peripheral area of the wafer.

The cleaning liquid emitted from the edge nozzle selectively removes an unnecessary material existing in the surface peripheral area of the wafer.

With the cleaning apparatus according to the second aspect of the present invention, the edge nozzle emits the cleaning liquid toward the surface peripheral area of the wafer while rotating the wafer in a horizontal plane. Thus, the cleaning liquid emitted to the surface peripheral area does not move inward due to a centrifugal force generated by rotation of the wafer. As a result, the unnecessary material existing in the surface peripheral area of the wafer is effectively removed without damaging the device area of the wafer.

Moreover, the emission of the cleaning liquid is controlled by the rotation speed of the wafer and the flow rate of the liquid and therefore, the cleaning action can be carried out with good controllability. This means that even if the distance between the edge of the device area and the end face of the wafer is as short as approximately 1.5 mm to 2.0 mm, the unnecessary material or materials existing on the wafer can be removed effectively.

In a preferred embodiment of the cleaning apparatus according to the second aspect of the invention, the cleaning liquid emitted from the edge nozzle has an emission direction oriented along a rotation direction of the wafer or outward with respect to a tangent of the wafer formed near a contact point of the liquid with the surface peripheral area of the wafer.

In another preferred embodiment of the etching apparatus according to the second aspect of the invention, a back nozzle is additionally provided. The back nozzle emits a cleaning liquid toward a back center of the wafer. The cleaning liquid emitted from the back nozzle removes an unnecessary material existing on a back of the wafer. In this embodiment, there is an additional advantage that not only the unnecessary material existing in the surface peripheral area of the wafer but also that existing on the back of the wafer can be removed simultaneously.

In still another preferred embodiment of the cleaning apparatus according to the second aspect of the invention, a surface nozzle is additionally provided. The surface nozzle emits a protecting liquid toward a surface center of the wafer. The protecting liquid emitted from the surface nozzle covers the device area of the wafer to protect the same against the cleaning liquid emitted from the edge nozzle. In this embodiment, there is an additional advantage that the device area can be prevented from being damaged due to the cleaning liquid emitted from the edge nozzle even if part of the cleaning liquid is jumped into the device area from the surface peripheral area.

In a further preferred embodiment of the cleaning apparatus according to the second aspect of the invention, a back nozzle and a surface nozzle are additionally provided. The back nozzle emits a cleaning liquid toward a back center of the wafer. The cleaning liquid emitted from the back nozzle removes an unnecessary material existing on a back of the wafer. The surface nozzle emits a protecting liquid toward a surface center of the wafer. The protecting liquid emitted from the surface nozzle covers the device area of the wafer to protect the same against the cleaning liquid emitted from the edge nozzle.

In a still further preferred embodiment of the cleaning apparatus according to the second aspect of the invention, the cleaning liquid emitted from the edge nozzle is beam-shaped. In this embodiment, there is an additional advantage that the controllability is further improved.

In the cleaning apparatus according to the second aspect of the invention also, the rotating means may be in any form if it can hold the semiconductor wafer and rotate it in a horizontal plane. However, it is preferred that the rotating means may be in any one of the following forms as described about the etching apparatus according to the first aspect.

According to a third aspect of the present invention, an etching method is provided, which is comprised of the steps of:
(a) rotating a semiconductor wafer in a horizontal plane;
   the wafer having a device area and a surface peripheral area on its surface;
   the surface peripheral area being located outside the device area; and
(b) emitting an etching liquid toward a surface peripheral area of the wafer by an edge nozzle, thereby selectively etching out an unnecessary material existing in the surface peripheral area.

With the etching method according to the third aspect of the present invention, because of the same reason as described about the etching apparatus according to the first aspect, the unnecessary material existing in the surface peripheral area of the wafer is effectively removed without damaging the device area of the wafer. Also, the etching action can be carried out with good controllability. Thus, even if the distance between the edge of the device area and the end face of the wafer is as short as approximately 1.5 mm to 2.0 mm, the unnecessary material existing on the wafer can be removed effectively.

In a preferred embodiment of the etching method according to the third aspect of the invention, the etching liquid emitted from the edge nozzle has an emission direction oriented along a rotation direction of the wafer or outward with respect to a tangent of the wafer formed near a contact point of the liquid with the surface peripheral area of the wafer.

In another preferred embodiment of the etching method according to the third aspect of the invention, an etching liquid is emitted toward a back center of the wafer by a back nozzle, thereby etching out an unnecessary material existing on a back of the wafer. In this embodiment, there is an additional advantage that not only the unnecessary material existing in the surface peripheral area of the wafer but also that existing on the back of the wafer can be removed simultaneously.

In still another preferred embodiment of the etching method according to the third aspect of the invention, a protecting liquid is emitted toward a surface center of the wafer by a surface nozzle, thereby covering the device area of the wafer to protect the same against the etching liquid emitted from the edge nozzle. In this embodiment, there is an additional advantage that the device area can be prevented from being damaged due to the etching liquid emitted from the edge nozzle even if part of the etching liquid is jumped into the device area from the surface peripheral area.

In a further preferred embodiment of the etching method according to the third aspect of the invention, an etching liquid is emitted toward a back center of the wafer by a back nozzle, thereby etching out an unnecessary material existing on a back of the wafer, and a protecting liquid is emitted toward a surface center of the wafer by a surface nozzle, thereby covering the device area of the wafer to protect the same against the etching liquid emitted from the edge nozzle.

In a still further preferred embodiment of the etching method according to the third aspect of the invention, the etching liquid emitted from the edge nozzle is beam-shaped. In this embodiment, there is an additional advantage that the controllability is further improved.

According to a fourth aspect of the present invention, a cleaning method is provided, which is comprised of the steps of:
(a) rotating a semiconductor wafer in a horizontal plane;
   the wafer having a device area and a surface peripheral area on its surface;
   the surface peripheral area being located outside the device area; and
(b) emitting a cleaning liquid toward a surface peripheral area of the wafer by an edge nozzle, thereby selectively removing an unnecessary material existing in the surface peripheral area.

With the cleaning method according to the fourth aspect of the present invention, because of the same reason as described about the cleaning apparatus according to the second aspect, the unnecessary material existing in the surface peripheral area of the wafer is effectively removed without damaging the device area of the wafer. Also, the cleaning action can be carried out with good controllability. Thus, even if the distance between the edge of the device area and the end face of the wafer is as short as approximately 1.5 mm to 2.0 mm, the unnecessary material existing on the wafer can be removed effectively.

In a preferred embodiment of the cleaning method according to the fourth aspect of the invention, the cleaning liquid emitted from the edge nozzle has an emission direction oriented along a rotation direction of the wafer or outward with respect to a tangent of the wafer formed near a contact point of the liquid with the surface peripheral area of the wafer.

In another preferred embodiment of the cleaning method according to the fourth aspect of the invention, a cleaning liquid is emitted toward a back center of the wafer by a back nozzle, thereby etching out an unnecessary material existing on a back of the wafer. In this embodiment, there is an additional advantage that not only the unnecessary material existing in the surface peripheral area of the wafer but also that existing on the back of the wafer can be removed simultaneously.

In still another preferred embodiment of the cleaning method according to the fourth aspect of the invention, a protecting liquid is emitted toward a surface center of the wafer by a surface nozzle, thereby covering the device area of the wafer to protect the same against the cleaning liquid emitted from the edge nozzle. In this embodiment, there is an additional advantage that the device area can be prevented from being damaged due to the cleaning liquid emitted from the edge nozzle even if part of the cleaning liquid is jumped into the device area from the surface peripheral area.

In a further preferred embodiment of the cleaning method according to the fourth aspect of the invention, a cleaning liquid is emitted toward a back center of the wafer by a back nozzle, thereby removing an unnecessary material existing on a back of the wafer, and a protecting liquid is emitted toward a surface center of the wafer by a surface nozzle, thereby covering the device area of the wafer to protect the same against the cleaning liquid emitted from the edge nozzle.

In a still further preferred embodiment of the cleaning method according to the fourth aspect of the invention, the cleaning liquid emitted from the edge nozzle is beam-shaped. In this embodiment, there is an additional advantage that the controllability is further improved.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
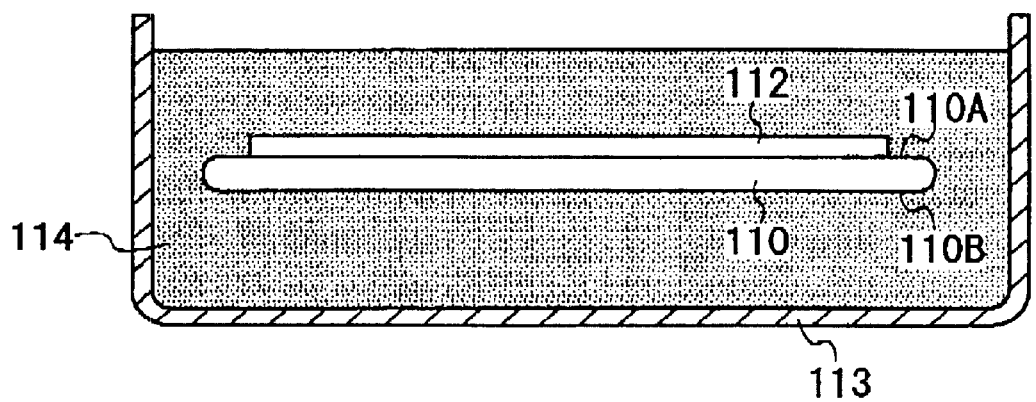
FIG. 1 is a schematic view showing a prior-art etching/cleaning method of a semiconductor wafer.
Figure 2:
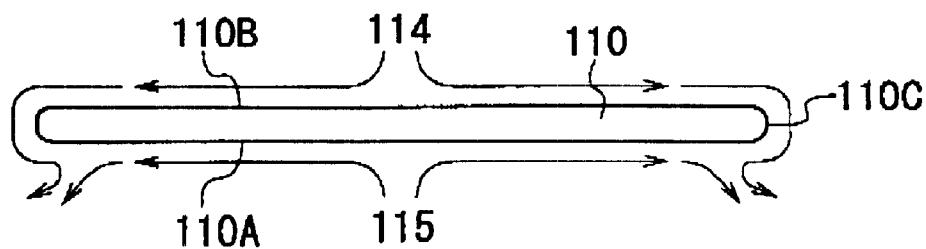
FIG. 2 is a schematic view showing another prior-art etching/cleaning method of a semiconductor wafer.

Preferred embodiments of the present invention will be described in detail below while referring to the drawings attached.

First Embodiment

Figure 3:
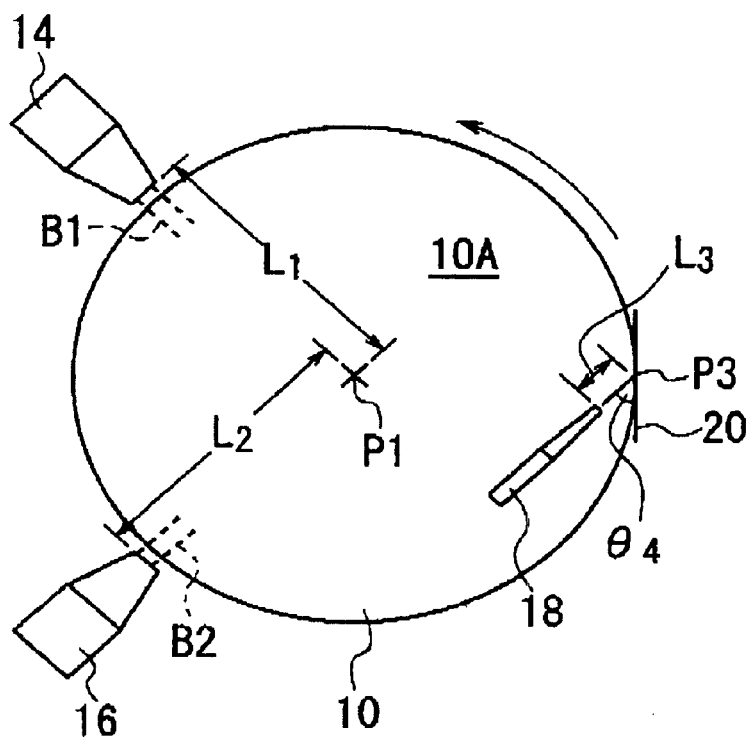
FIG. 3 is a schematic plan view showing the configuration of an etching/cleaning apparatus according to a first embodiment of the invention.
Figure 4:
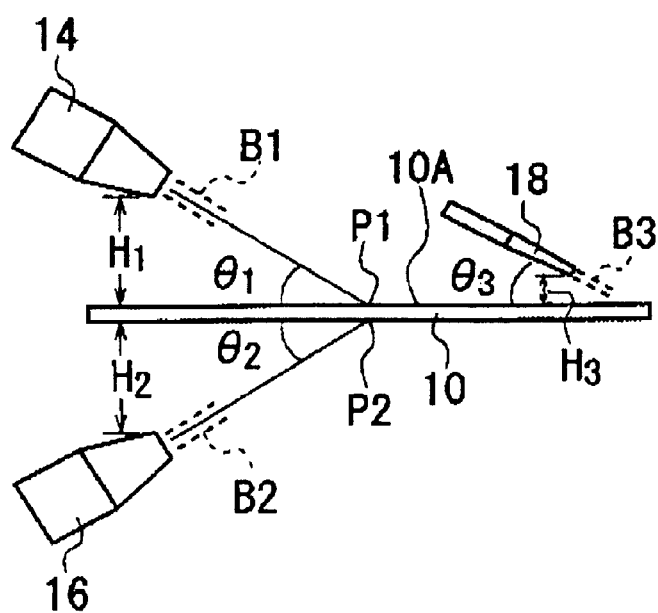
FIG. 4 is a schematic side view showing the configuration of the apparatus according to the first embodiment of FIG. 3.

An etching/cleaning apparatus according to a first embodiment has a configuration as shown in FIGS. 3 and 4. This apparatus serves as an etching apparatus when an etching liquid is supplied and as a cleaning apparatus when a cleaning liquid is supplied.

The etching/cleaning apparatus shown in FIGS. 3 and 4 is comprised of a surface nozzle 14 for emitting a protecting liquid $L_P$ toward the surface center P1 of the surface 10A of a circular single-crystal Si wafer 10, a back nozzle 16 for emitting an etching liquid $L_E$ or a cleaning liquid $L_C$ toward the back center P2 of the back 10B of the wafer 10, and an edge nozzle 18 for emitting the etching or cleaning liquid $L_E$ or $L_C$ toward the edge of the wafer 10.

Figure 16:
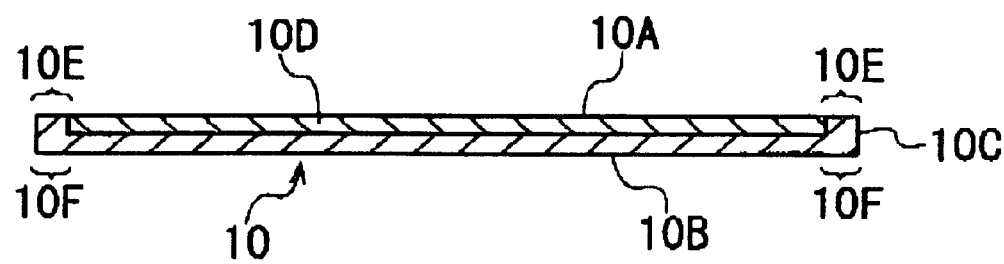
FIG. 16 is a schematic cross-sectional view of a semiconductor wafer, which shows the various areas of the wafer used in the etching or cleaning method according to the invention.

As shown in FIG. 16, the wafer 10 has the flat surface 10A, the flat back 10B, and the end face 10C extending along the periphery of the wafer 10 between the surface 10A and the back 10B. The wafer 10 further has a device area 10D in the surface 10A. Various semiconductor devices and elements and their wiring lines are formed in the device area 10D. The surface peripheral area 10E, which has an approximately circular-ringed shape, is formed on the surface 10A to extend along the end face 10C between the device area 10D and the end face 10C.

On the back 10B of the wafer 10, the back peripheral area 10F is formed, in which an undesired or unnecessary material or materials to be removed are present. Similar to the surface peripheral area 10E, the back peripheral area 10F has an approximately circular-ringed shape.

The location and the angle with respect to the wafer 10 of these nozzles 14, 16, and 18 are changed dependent on the size or diameter of the wafer 10. For example, to cope with the wafer 10 with 150 mm, 200 mm, or 300 mm in diameter, the following setting is preferred. If these settings are taken, the objects of the invention can be easily accomplished.

Returning to FIGS. 3 and 4, the height $H_1$ of the end of the surface nozzle 14 from the surface 10A of the wafer 10 is preferably set as a value in the range of 10 mm to 100 mm. The height $H_2$ of the end of the back nozzle 16 from the back 10B of the wafer 10 is preferably set as a value in the range of 10 mm to 100 mm. The height $H_3$ of the end of the edge nozzle 18 from the surface 10A is preferably set as a value in the range of 5 mm to 50 mm. In this embodiment, $H_1$ is set as 50 mm, $H_2$ is set as 50 mm, and $H_3$ is set as 10 mm.

The distance $L_1$ of the end of the surface nozzle 14 from the surface center P1 of the wafer 10 is preferably set as a value in the range of 70 mm to 200 mm. The distance $L_2$ of the end of the back nozzle 16 from the back center P2 of the wafer 10 is preferably set as a value in the range of 70 mm to 200 mm. The distance $L_3$ of the end of the edge nozzle 18 from the point P3 where the longitudinal axis of the nozzle 18 intersects the surface 10A of the wafer 10 is preferably set as a value in the range of 1 mm to 50 mm. Within these ranges, the objects of the invention can be easily accomplished. In this embodiment, $L_1$ is set as 120 mm, $L_2$ is set as 120 mm, and $L_3$ is set as 10 mm.

The angle $\theta_1$ of the surface nozzle 14 from the surface 10A is preferably set as a value in the range of 15° to 60°. The angle $\theta_2$ of the back nozzle 16 from the back 10B is preferably set as a value in the range of 15° to 60°. The angle $\theta_3$ of the edge nozzle 18 from the surface 10A is preferably set as a value in the range of 10° to 50°. In this embodiment, $\theta_1$ is set as 45°, $\theta_2$ is set as 45°, and $\theta_3$ is set as 35°.

The angle $\theta_4$ of the edge nozzle 18 with respect to the tangent 20 of the wafer 10 at the point P3 where the longitudinal axis of the nozzle 18 intersects the end face 10C (i.e., the edge) of the wafer 10 is preferably set as a value in the range of 0° to 90°. In this embodiment, $\theta_4$ is set as 45°. The value of the angle $\theta_4$ is determined in such a way that the etching or cleaning liquid $L_E$ or $L_C$ emitted from the nozzle 18 does not flow inwardly from the surface peripheral area 10E.

Figure 17:
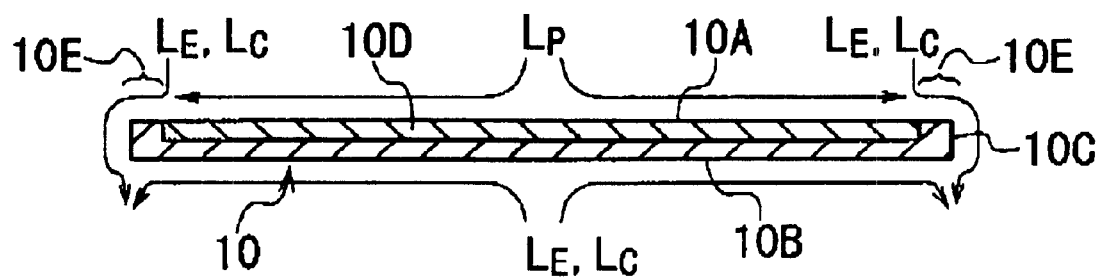
FIG. 17 is a schematic cross-sectional view of a semiconductor wafer, which shows the flowing state of the etching or cleaning liquid and the protecting liquid used in the etching or cleaning method according to the invention.

The protecting liquid $L_P$ is emitted from the surface nozzle 14 toward the surface center P1 of the wafer 10. Since the wafer 10 is rotated at a specific speed in a horizontal plane during operation, the liquid $L_P$ is affected by a centrifugal force caused by the rotation. Thus, the liquid $L_P$ moves outward from the vicinity of the center P1 along the surface 10A, covering entirely the device area 10D for protection against the etching or cleaning liquid $L_E$ or $L_C$ emitted from the edge nozzle 18. The flowing state of the liquid $L_P$ is shown in FIG. 17.

The etching or cleaning liquid $L_E$ or $L_C$ is emitted from the edge nozzle 18 toward the surface peripheral area 10E or the edge of the wafer 10. Thus, the liquid $L_E$ or $L_C$ is selectively contacted with the surface peripheral area 10E of the wafer 10. Due to the emission orientation and the centrifugal force caused by the rotation, the liquid $L_E$ or $L_C$ does not enter the device area 10D and is dropped along the end face 10C, as shown in FIG. 17. Moreover, since the protecting liquid $L_P$ emitted from the surface nozzle 14 covers the entire device area 14D, the separation of the device area 14D from the liquid $L_E$ or $L_C$ is ensured.

The etching or cleaning liquid $L_E$ or $L_C$ is emitted from the back nozzle 16 also, which is toward the back center P2 of the wafer 10. Thus, the liquid $L_E$ or $L_C$ can be contacted with the whole back 10B. Due to the centrifugal force caused by the rotation of the wafer 10, the liquid $L_E$ or $L_C$ moves outward from the center P2 along the back 10B and is dropped near the end face 10C, as shown in FIG. 17.

As seen from the above description, the protecting liquid $L_P$ emitted from the surface nozzle 14 moves automatically from the surface center P1 toward the edge of the wafer 10 due to the centrifugal force. Thus, the emission state of the liquid $L_P$ may be optionally changed, it if provides the desired function of covering or protecting the device area 10D. For example, the liquid $L_P$ may be emitted to form a beam, or it may be emitted to form a suitable section or fan, or it may be sprayed. This is applicable to the etching or cleaning liquid $L_E$ or $L_C$ emitted from the back nozzle 16.

The emission state of the etching or cleaning liquid $L_E$ or $L_C$ emitted from the edge nozzle 18 needs to be contacted with the surface peripheral area 10E and the end face 10C of the wafer 10 with satisfactory controllability, which must be accomplished without contacting the liquid $L_E$ or $L_C$ with the device area 10D. From this point of view, for example, the etching or cleaning liquid $L_E$ or $L_C$ may be emitted to form a narrow beam with a diameter of 0.5 mm or 2.0 mm. Alternately, it may be emitted to form a suitable section or fan extending along the edge of the wafer 10, or it may be selectively sprayed toward a part of the area 10E.

Figure 5:
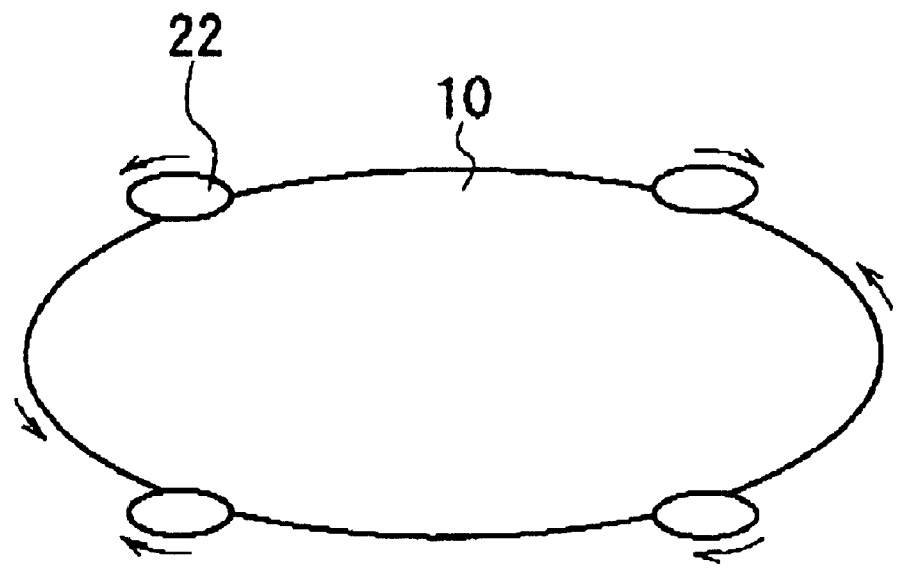
FIG. 5 is a schematic perspective view showing a holding structure of the wafer used in the apparatus according to the first embodiment of FIG. 3.
Figure 6:
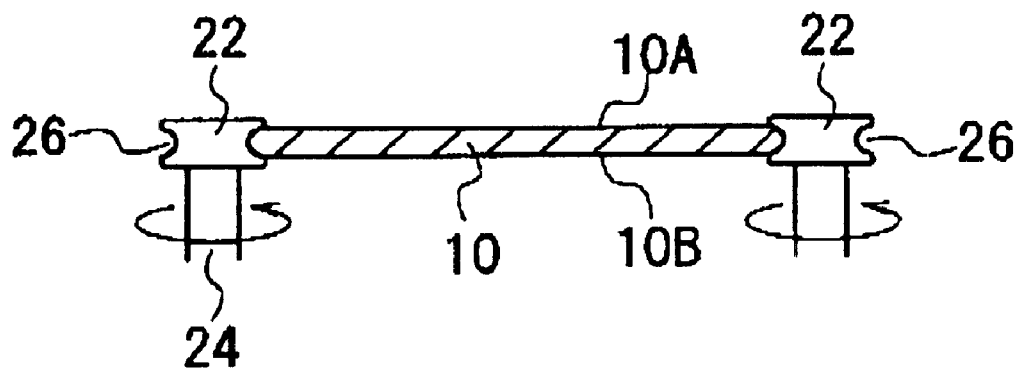
FIG. 6 is a schematic side showing the holding structure of the wafer shown in FIG. 5.

The etching/cleaning apparatus according to the first embodiment comprises a wafer-rotating mechanism, as shown in FIGS. 5 and 6. This mechanism, which is of the roller-chucking type, includes four rollers 22 connected to corresponding rotational shafts 24. The rollers 22 are arranged at equal intervals along the periphery of the wafer 10 in the same horizontal plane. When the wafer 10 is held, the wafer 10 is engaged with the recesses 26 of the four rollers 22 to be placed in the horizontal plane. Due to synchronous rotation of these rollers 22, the wafer 10 is rotated in the horizontal plane at a specific speed, as shown in FIGS. 5 and 6.

The number of the rollers 22 is four in this embodiment. However, it is not limited thereto. It is preferably set as a number ranging from 3 to 8.

With the wafer-holding mechanism of FIGS. 5 and 6, each roller 22 does not always contact with the end face 10C of the wafer 10 at the same position during operation. Thus, this mechanism is preferred for the etching or cleaning method of the wafer 10 according to the invention described later, where the whole end face 10C needs to be subjected to the etching or cleaning action. Also, since the location of the rollers 22 and the shafts 24 is fixed during operation, there is no possibility that the etching or cleaning liquid $L_E$ is $L_C$ emitted from the back nozzle 16 is blocked or stopped by the shafts 24. This means that there arises an additional advantage that the etching or cleaning liquid $L_E$ or $L_C$ is efficiently contacted with the back 10B of the wafer 10.

Although the number of the edge nozzle 18 is one in the first embodiment, it is not limited thereto. The number of the nozzle 18 may be two or more according to the necessity.

With the etching/cleaning apparatus according to the first embodiment of FIGS. 3 to 6, the wafer-holding mechanism of FIGS. 5 and 6 is provided for holding the wafer 10 in a horizontal plane and for rotating the wafer 10 at a specific rotation speed. Also, the surface nozzle 14 is provided for emitting the protecting liquid $L_P$ toward the surface center P1 of the wafer 10, the back nozzle 16 is provided for emitting the etching or cleaning liquid $L_E$ or $L_C$ toward the back center P2 of the wafer 10, and the edge nozzle 18 is provided for emitting the etching or cleaning liquid $L_E$ or $L_C$ toward the edge of the wafer 10.

Moreover, the etching or cleaning liquid $L_E$ or $L_C$ emitted from the edge nozzle 18 is controlled to contact with the surface peripheral area 10E of the rotating wafer 10 and at the same time, the etching or cleaning liquid $L_E$ or $L_C$ emitted from the back nozzle 16 is controlled to contact entirely or partially with the back 10B of the same wafer 10. The protecting liquid $L_P$ emitted from the surface nozzle 14 is controlled to cover the entire device area 10D of the wafer 10 to protect the same against the etching or cleaning liquid $L_E$ or $L_C$ emitted from the edge nozzle 18.

Accordingly, the surface peripheral area 10E, the end face 10C, and the back 10B of the wafer 10 can be effectively etched or cleaned to remove the undesired or unnecessary material(s) or contaminant(s) existing on the wafer 10, without applying any damages to the semiconductor device or elements and wiring lines in the device area 10D of the wafer 10.

Additionally, since the etching or cleaning liquid $L_E$ or $L_C$ can be emitted from the edge nozzle 18 as a liquid beam or liquid fan toward the surface peripheral area 10E, the contact point of the liquid $L_E$ or $L_C$ with the area 10E can be set at satisfactory high precision. As a result, the device area 10D can be expanded toward the edge or end face 10C of the wafer 10, thereby making the width of the area 10E (i.e., the distance between the areas 10D and 10E) as short as possible (e.g., approximately 1.5 mm to 2.0 mm).

Preferred examples of the etching liquid $L_E$, the cleaning liquid $L_E$, and the protecting liquid $L_P$ are disclosed later.

Second Embodiment

Figure 7:
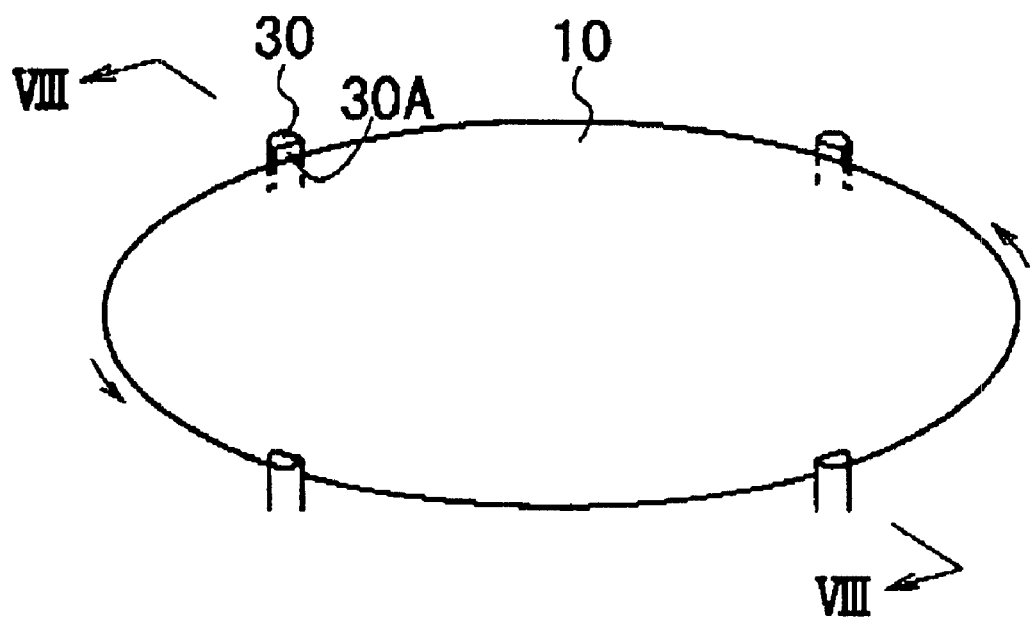
FIG. 7 is a schematic perspective view showing another holding structure of the wafer used in an etching/cleaning apparatus according to a second embodiment of the invention.
Figure 8:
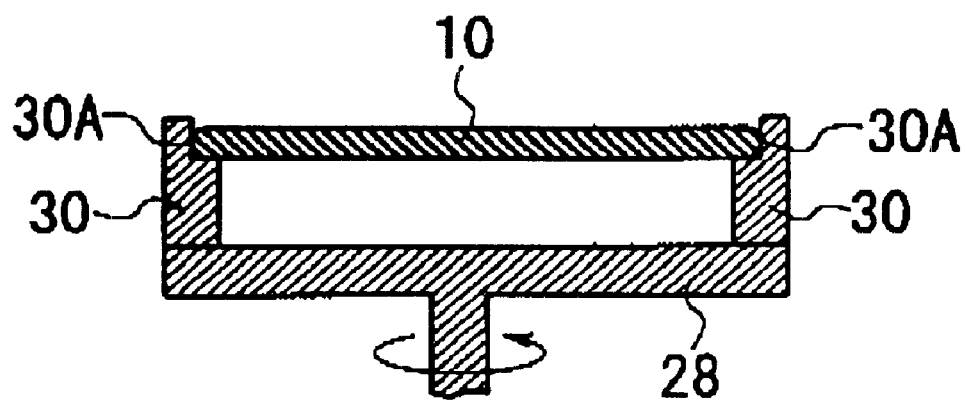
FIG. 8 is a schematic side view showing the holding structure of the wafer shown in FIG. 7.

FIGS. 7 and 8 show schematically a wafer-holding mechanism used in an etching/cleaning apparatus according to a second embodiment, which is a variation of the mechanism. The other configuration of the apparatus according to the second embodiment is the same as that of the apparatus according to the first embodiment of FIGS. 3 to 6. Thus, the explanation about the same configuration is omitted here for the sake of simplification.

As shown in FIGS. 7 and 8, the wafer-holding mechanism is of the pin-chucking type, which includes four pins 30 joined to a rotational supporting member 28. The pins 30 are arranged at equal intervals along the circular edge of the member 28. Each pin 30 has a pocket 30A on which the edge of the wafer 10 is placed and engaged therewith. The wafer 10 is placed and held on the four pockets 30A of the pins 30. The wafer 10 is rotated in a horizontal plane due to the rotation of the member 28, as shown in FIGS. 7 and 8.

The number of the pins 30 is four in this embodiment. However, it is not limited thereto and it may take any number. It is preferably set as a number ranging from 3 to 8.

With the wafer-holding mechanism of FIGS. 7 and 8, unlike the mechanism of FIGS. 5 and 6 in the first embodiment, each pins 30 is kept contacted with the end face 10C and the back 10B of the wafer 10 at the same position during operation. Thus, there is a problem that the parts of the end face 10C covered with the pins 30 are not etched or cleaned. To avoid this problem, it is preferred that the chucking force of the wafer-holding mechanism is relaxed or released instantaneously and at the same time, the rotation speed is lowered a bit during operation. Thus, the rotating wafer 10 can be shifted in its holding position due to the inert force.

Alternately, the rotation of the wafer 10 may be temporarily stopped to lift the wafer 10 from the pins 30 with a proper handler (not shown) or the like. In this case also, the holding position of the wafer 10 can be shifted or changed. Furthermore, two wafer-holding mechanisms of the pin-chucking type shown in FIGS. 7 and 8 may be provided for supporting the wafer 10. In this case, a first one of the mechanisms is used to hold the wafer 10 and then, a second one of them is used therefor. Thus, the wafer 10 can be shifted in its holding position.

Needles to say, the apparatus according to the second embodiment has the same advantages as those in the apparatus according to the first embodiment.

In addition, the wafer-holding mechanism of FIGS. 7 and 8 may be combined with the mechanism shown in FIGS. 5 and 6. In this case, the rollers 22 may be contacted with the end face 10C of the wafer 10 during a front half of an etching or cleaning process and then, the pins 30 may be contacted with the end face 10C at different holding positions from those for the rollers 22 during a rear half of the process, and vice versa. Thus, the rotating wafer 10 can be shifted or switched in its holding position during the same process without means for shifting the holding position of the wafer 10.

Third Embodiment

Figure 9:
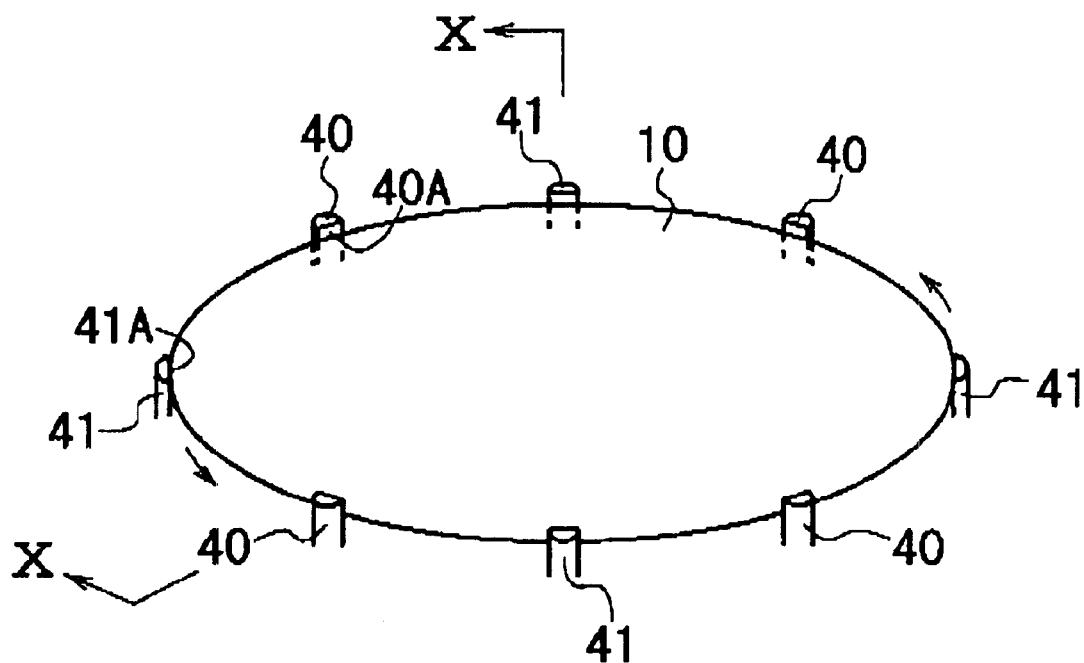
FIG. 9 is a schematic perspective view showing a further holding structure of the wafer used in an etching/cleaning apparatus according to a third embodiment of the invention.
Figure 10:
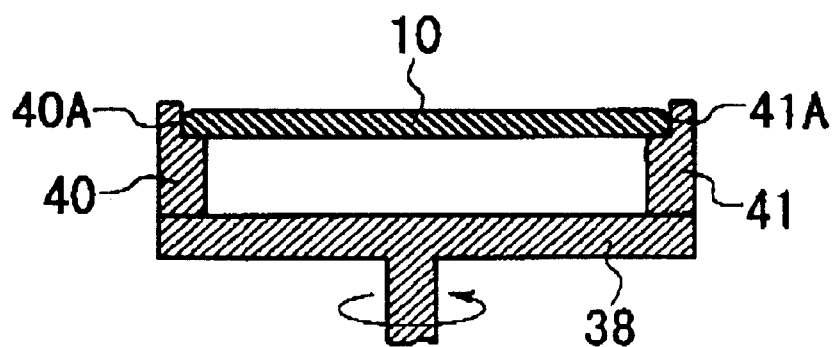
FIG. 10 is a schematic side view showing the holding structure of the wafer shown in FIG. 9.

FIGS. 9 and 10 show schematically a wafer-holding mechanism used in an etching/cleaning apparatus according to a third embodiment, which is another variation of the mechanism. Because the other configuration of the apparatus according to the third embodiment is the same as that of the apparatus according to the first embodiment, the explanation about the same configuration is omitted here for the sake of simplification.

As shown in FIGS. 9 and 10, similar to the second embodiment, the wafer-holding mechanism is of the pin-chucking type. This mechanism includes four pins 40 and four pins 41 joined to a rotational supporting member 38. The pins 40 and 41 are alternately arranged at equal intervals along the circular edge of the member 38. Each pin 40 has a pocket 40A on which the edge of the wafer 10 is placed and engaged therewith. Each pin 41 has a similar pocket 41A on which the edge of the wafer 10 is placed and engaged therewith. When the wafer 10 is rotated, it is placed and held on the eight pockets 40A and 41A of the pins 40 and 41. The wafer 10 is rotated in a horizontal plane due to the rotation of the member 38, as shown in FIGS. 9 and 10.

The number of the pins 40 or 41 is four in this embodiment. However, it is not limited thereto and it may take any number. It is preferably set as 3.

With the wafer-holding mechanism of FIGS. 9 and 10, unlike the mechanism of FIGS. 7 and 8 in the second embodiment, the four pins 40 are contacted with the end face 10C of the wafer 10 during a front half of an etching or cleaning process. Then, the four pins 41 are contacted with the end face 10C during a rear half of the process. Thus, the rotating wafer 10 can be shifted or switched in its holding position during the same process. There is an additional advantage that the means for shifting the holding position of the wafer 10 is unnecessary.

Needless to say, the apparatus according to the third embodiment has the same advantages as those in the apparatus according to the first embodiment.

Fourth Embodiment

Figure 11:
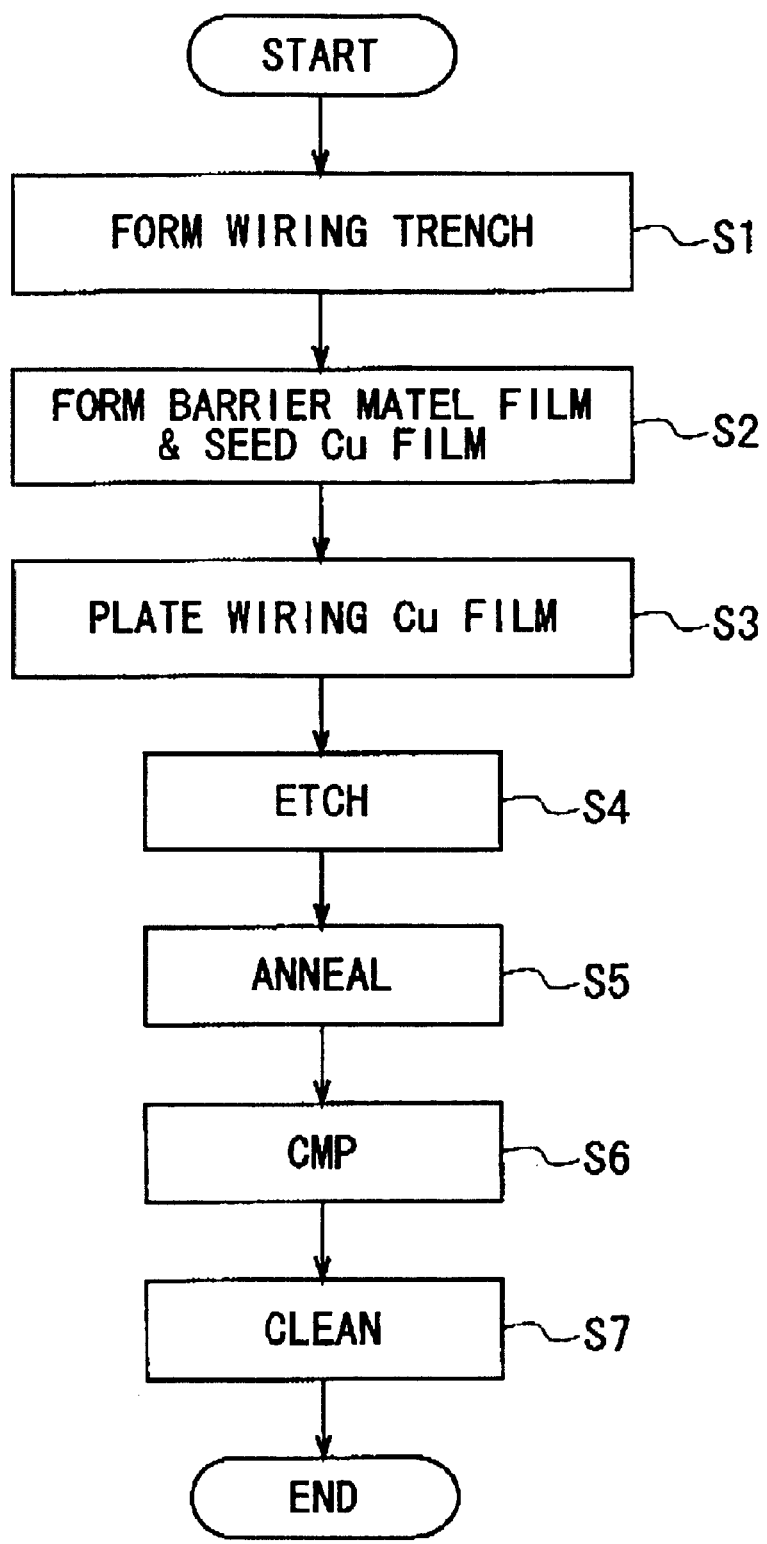
FIG. 11 is a flow chart showing the steps of forming Cu wiring lines using the damascene process, in which one of the etching/cleaning apparatuses according to the first to third embodiments of the invention is used.

FIG. 11 shows the process flow of forming Cu wiring lines using the damascene process and FIGS. 12A to 12F show the steps thereof, respectively, in which an etching method and a cleaning method according to a fourth embodiment are included. In this process, any one of the above-explained etching/cleaning apparatuses according to the first to third embodiments may be used.

In this process, it is needless to say that a lot of Cu wiring lines are formed. However, for simplification or description, only one of the wiring lines is explained and illustrated here.

Figure 12A:
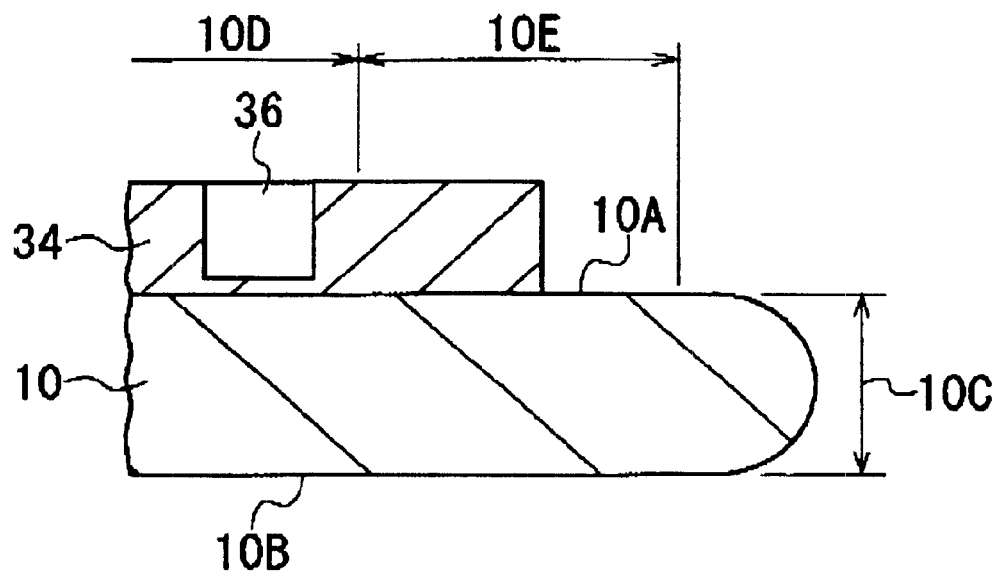
FIGS. 12A to 12F are schematic, partial cross-sectional views of a semiconductor wafer showing the formation steps of the Cu wiring lines, respectively, which includes an etching method and a cleaning method according to a fourth embodiment of the invention.

In the step S1, a wiring trench is formed. Specifically, as shown in FIG. 12A, a silicon dioxide ($SiO_2$) film 34 is formed on the surface 10A of the Si wafer 10 by a known method. The $SiO_2$ film 34 is formed to cover the whole device area 10D and to laterally protrude from the area 10D. Thus, the periphery or edge of the $SiO_2$ film 34 is located within the surface peripheral area 10E. In this embodiment, the width of the surface peripheral area 10E is set as approximately 5 mm.

Then, a wiring trench 36 is formed in the $SiO_2$ film 34 to be located in the device area 10D by a known method. The state at this stage is shown in FIG. 12A.

In the step S2, a barrier metal film and a seed Cu film are formed. The barrier metal film is used to prevent the Cu atoms from diffusing into the $SiO_2$ film 34 and/or the wafer 10. The seed Cu film is used to form a seed for plating.

Figure 12B:
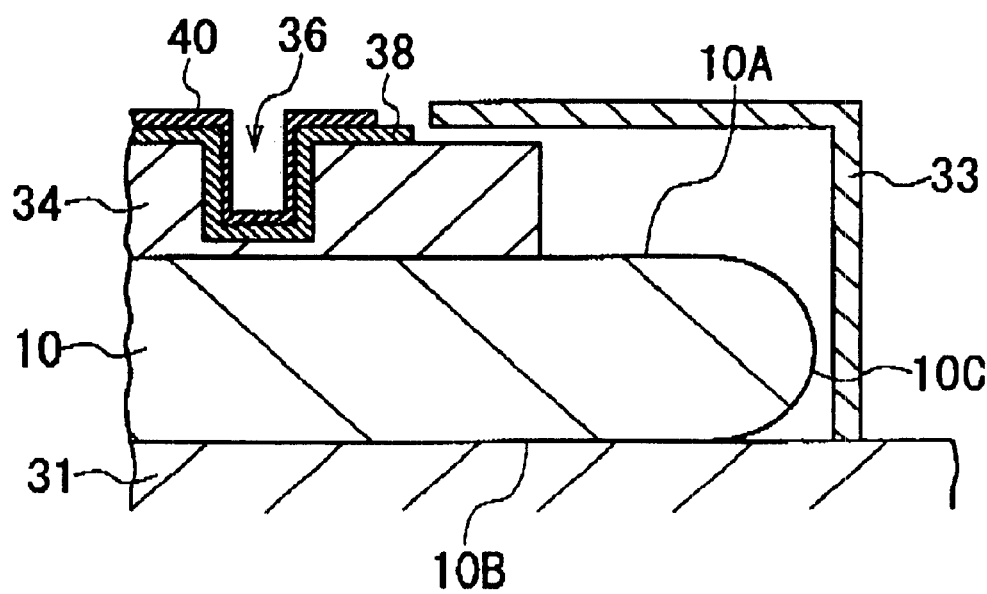

Specifically, as shown in FIG. 12B, after the wafer 10 is placed on a wafer stage 31 of a sputtering system, a barrier metal film 38, which is made of Ta, TaN, or the like, is formed on the $SiO_2$ film 34 to cover the trench 36 by sputtering. Subsequently, a seed Cu film 40 is formed on the barrier metal film 38 to cover the trench 36 by sputtering. The state at this stage is shown in FIG. 12B.

The reference numeral 33 in FIG. 12B denotes a shield ring for preventing the sputtered species from being deposited on the surface peripheral area 10E and the end face 10C of the wafer 10. The shield ring 33 is placed on the wafer stage 31 during the sputtering process.

Figure 12C:
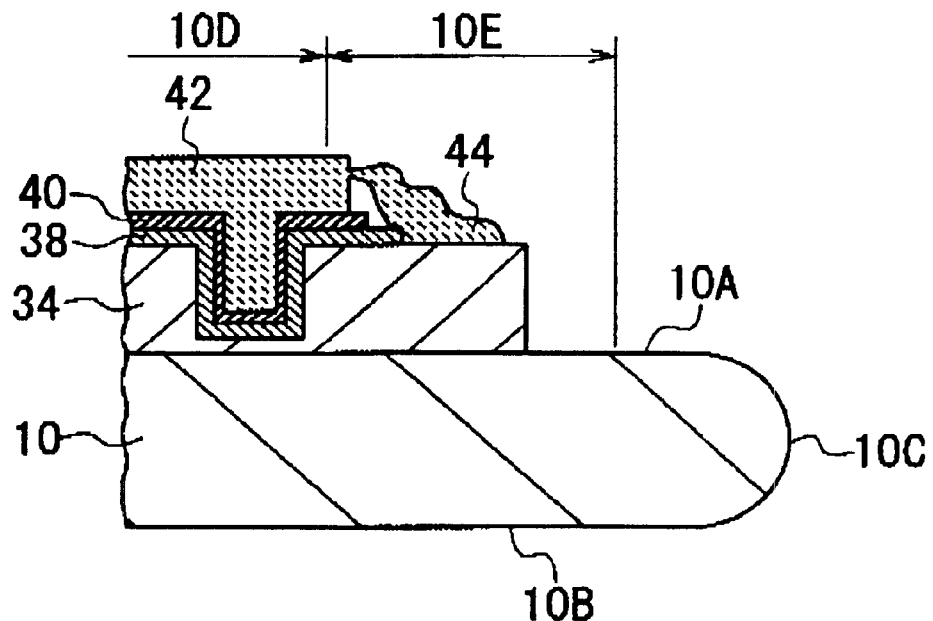

In the step S3, a wiring Cu film is formed by electroplating. Specifically, a ring-shaped blocking member (i.e., a so-called O-ring, not shown) is placed on the $SiO_2$ film 34, forming a space on the seed Cu film 40. Then, a proper plating liquid or solution is supplied to the space, thereby forming a wiring Cu film 42 on the film 40, as shown in FIG. 12C.

At this stage, the plating liquid usually leaks out of the O-ring. Thus, an unnecessary Cu film 44 is formed on the SiO$_2$ film 34 in the peripheral area 10E. This film 44 is easily detached from the film 34 and therefore, it will be a contaminant for the production lines. As a result, the film 44 must be removed prior to the next process.

In the step S4, the unnecessary Cu film 44 is removed by etching using the above-explained etching/cleaning apparatus according to the first, second, or third embodiment. Since an etching liquid L$_E$ is supplied, the above-explained etching/cleaning apparatus serves as an etching apparatus.

Specifically, first, the wafer 10 with the films 34, 38, 40, 42, and 44 is held to be in a horizontal plane by the wafer-holding mechanism. Next, a protecting liquid L$_P$ is emitted from the surface nozzle 14 toward the surface center P1 of the wafer 10, covering the whole device area 10D. As the protecting liquid L$_P$, any liquid having no etching action to Cu, such as pure water or a water solution of any organic acid is used. Preferably, as the solution of an organic acid, a solution of oxalic acid, citric acid, malonic acid, or the like is used, the concentration of which is preferably set as 0.001% to 5%. This is because these solutions are easily accessible, easily removed, and apply no damage to the device area 10D.

In this embodiment, pure water is used as the protecting liquid L$_P$.

At the same time as the emission of the protecting liquid L$_P$, an etching liquid L$_E$ is emitted from the edge nozzle 18 toward the edge of the wafer 10, covering the whole surface peripheral area 10E. As the etching liquid L$_E$, any liquid having a large etch selectivity (Cu/SiO$_2$) is used, because the unnecessary Cu film 44 existing in the area 10E needs to be selectively etched while the SiO$_2$ film 34 is prevented from being etched.

Preferably, as the etching liquid L$_E$, any acid or any alkali solution containing H$_2$O$_2$ may be used. For example, FPM (HF/H$_2$O$_2$/H$_2$O), SPM (H$_2$SO$_4$/H$_2$O$_2$/H$_2$O), HPM (HCl/H$_2$O$_2$/H$_2$O), water solution of nitric hydrogen peroxide (HNO$_3$/H$_2$O$_2$/H$_2$O), APM (NH$_4$OH/H$_2$O$_2$/H$_2$O), thick nitric acid (HNO$_3$), or the like, is preferred. This is because these liquids provide satisfactorily high etch selectivity between Cu and SiO$_2$ and they are easily accessible.

These solutions have a suitable composition providing a high etch selectively (Cu/SiO$_2$) in the following way.

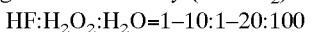
HF:H$_2$O$_2$:H$_2$O=1–10:1–20:100

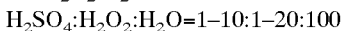
H$_2$SO$_4$:H$_2$O$_2$:H$_2$O=1–10:1–20:100

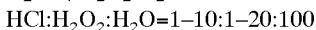
HCl:H$_2$O$_2$:H$_2$O=1–10:1–20:100

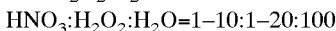
HNO$_3$:H$_2$O$_2$:H$_2$O=1–10:1–20:100

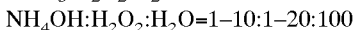
NH$_4$OH:H$_2$O$_2$:H$_2$O=1–10:1–20:100

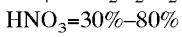
HNO$_3$=30%–80%

Figure 13:
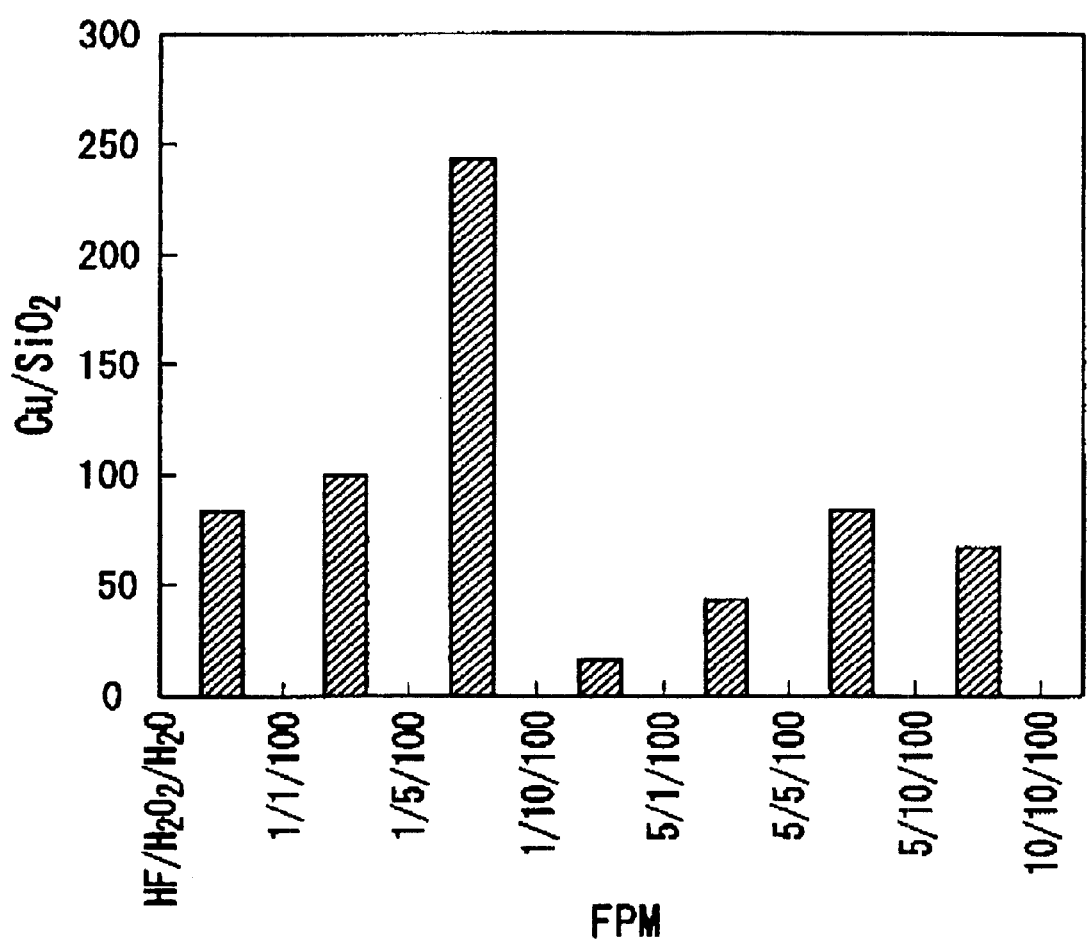
FIG. 13 is a graph showing the composition dependence of the etch selectivity between Cu and $SiO_2$ of FPM.

As an example, the composition dependence of the etch selectively (Cu/SiO$_2$) of FPM is shown in FIG. 13. As seen from this figure, the etch selectivity (Cu/SiO$_2$) of FPM is maximized to about 250 at the composition ratio of HF:H$_2$O$_2$:H$_2$O=1:10:100.

In the fourth embodiment, FPM is used as the etching liquid P$_E$ emitted from the edge nozzle 18.

While the waver 10 is rotated in a horizontal plane by the wafer-holding mechanism, pure water (i.e., the protecting liquid L$_P$) is emitted from the surface nozzle 14 and FPM (i.e., the etching liquid L$_E$) is emitted from the edge nozzle 18. The pure water supplied to the vicinity of the surface center P1 of the wafer 10 automatically expands toward the edge of the wafer 10 along the surface 10A due to the centrifugal force, thereby covering the entire device area 10D. The FPM supplied in the surface peripheral area 10E moves toward the edge of the wafer 10 along the surface 10A due to the centrifugal force, thereby contacting with the entire area 10E. Thus, even if the FPM emitted from the nozzle 18 is slightly returned or jumped toward the device area 10D due to the rotational movement of the wafer 10, there is no possibility that the FPM is contacted with the device area 10D because of the pure water. As a result, the wiring Cu film 42 and the SiO$_2$ film 34 are prevented from being damaged by the FPM.

Figure 12D:
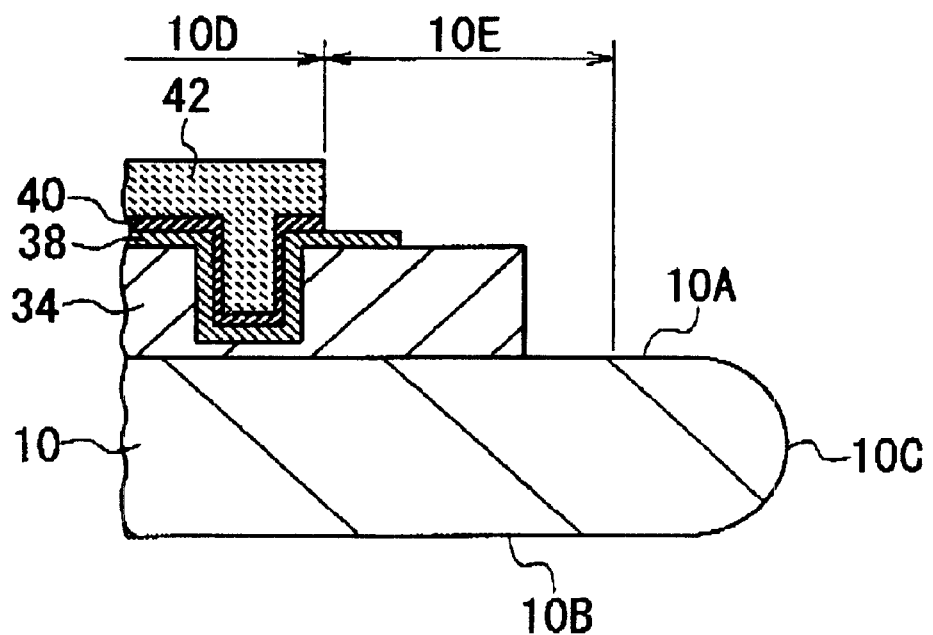

Moreover, the FPM is emitted from the edge nozzle 18 as a beam. Thus, the contact point of the FPM beam with the surface 10A can be correctly adjusted, which realizes correct removal of the unnecessary Cu film 44 in the area 10E with satisfactory controllability. The state at this stage is shown in FIG. 12D, where the Cu film 44 is entirely removed and the edges of the films 38, 40, and 42 located outside the device area 10D are removed.

In the step S5, the remaining wiring Cu film 42 in the device area 10D is annealed by a known method, thereby improving the quality of the film 42.

Figure 12E:
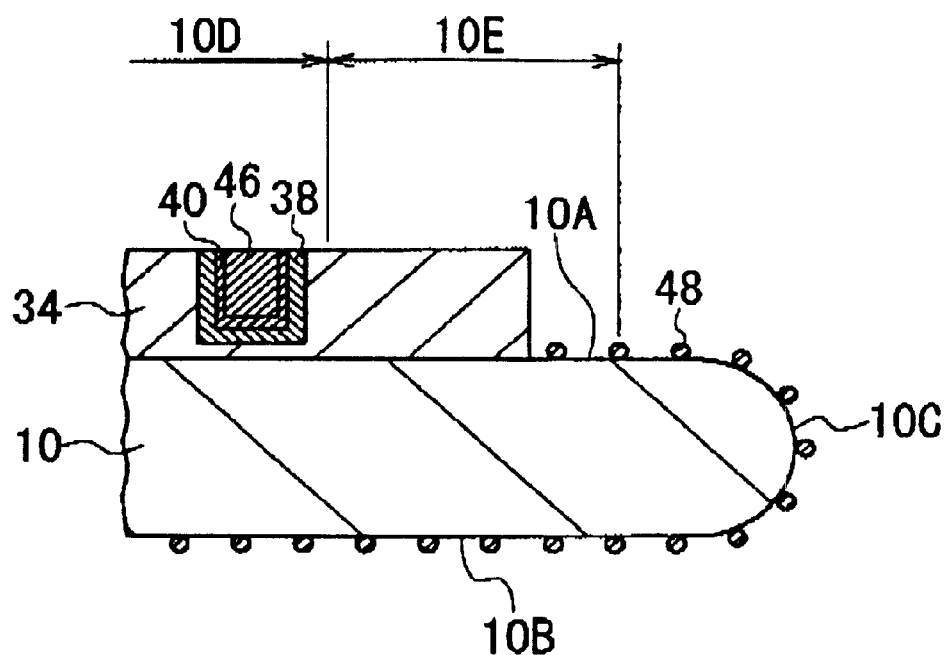

In the step S6, to selectively remove the wiring Cu film 42, the seed Cu film 40, and the barrier metal film 38 protruding from the trench 36 of the SiO$_2$ film 34, a CMP process is carried out. Thus, as shown in FIG. 12E, a Cu wiring line 46 is formed in the trench 36 and at the same time, the seed Cu film 40 and the barrier metal film 38 are left in the trench 36.

Through this CMP process, a polishing waste 48 is attached on the surface 10A in the peripheral area 10E, on the end face 10C, and the back 10B of the wafer 10. In this embodiment, the waste 48 is made of Cu and the barrier metal.

In the step S7, the polishing waste 48 is removing using the above-explained etching/cleaning apparatus according to the first, second, or third embodiment. Since a cleaning liquid L$_C$ is supplied, the above-explained etching/cleaning apparatus serves as a cleaning apparatus.

Specifically, first, the wafer 10 is held on the wafer-holding mechanism. Next, while the wafer 10 is rotated in a horizontal plane by the wafer-holding mechanism, pure water (i.e., the protecting liquid L$_P$) is emitted from the surface nozzle 14 toward the surface center P1 of the wafer 10, covering the whole device area 10D. At the same time as this, FPM (i.e., the cleaning liquid L$_C$) is emitted from the edge nozzle 18 toward the edge of the wafer 10 to cover the whole surface peripheral area 10E while FPM is emitted from the back nozzle 16 toward the back center P2 of the wafer 10 to cover the whole back 10B.

The pure water supplied to the vicinity of the surface center P1 moves outward along the surface 10A due to the centrifugal force, covering and protecting the entire device area 10D. The FPM supplied to the surface peripheral area 10E moves toward the edge of the wafer 10 along the surface 10A to be dropped therefrom due to the centrifugal force, removing the polishing waste 48 existing in the area 10E and one the end face 10C. Thus, the surface peripheral area 10E and the end face 10C are fully cleaned.

On the other hand, the FPM supplied to the vicinity of the back center P2 moves outward 10 along the back 10B to be dropped therefrom due to the centrifugal force, removing the polishing waste 48 existing on the back 10B. Thus, the back 10B of the wafer 10 is fully cleaned.

Because the device area 10D is entirely covered with the pure water during the cleaning step S7, even if he FPM emitted from the nozzle 18 is slightly returned toward the device area 10D due to the rotational movement of the wafer 10, there is no possibility that the FPM is contacted with the device area 10D. As a result, the wiring Cu film 46 and the SiO$_2$ film 34 are prevented from being damaged by the FPM.

Figure 12F:
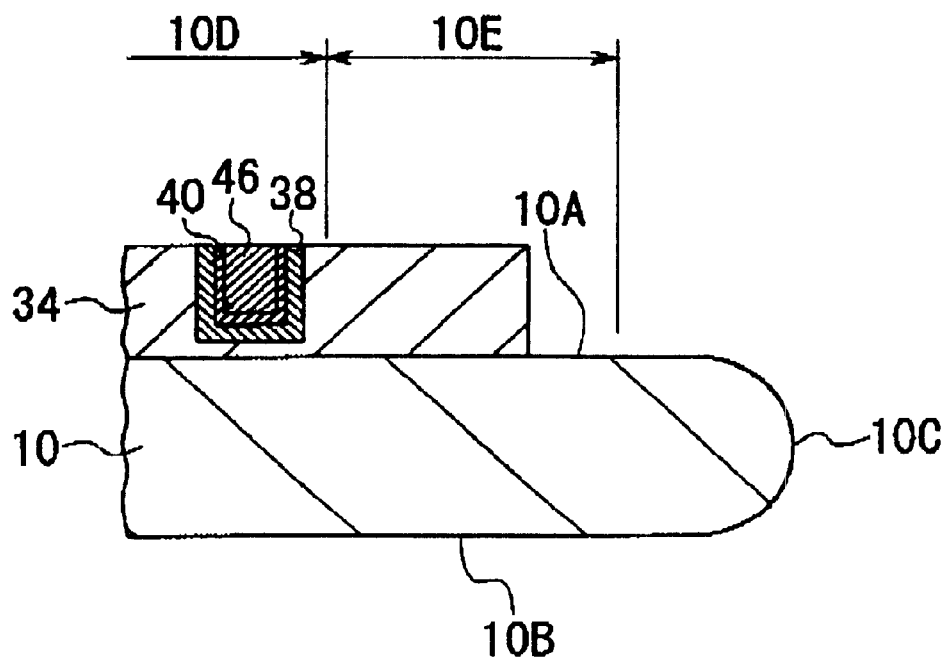

The state after the cleaning step S7 is completed is shown in FIG. 12F.

As the cleaning liquid L$_C$, similar to the etching liquid L$_E$, any acid or any alkali solution containing H$_2$O$_2$ may be used. This is because H$_2$O$_2$ has a good cleaning action of the polishing waste 48 of Cu. For example, SPM, HPM, water solution of nitric hydrogen peroxide, APM, or thick nitric acid may be preferred. These are easily accessible, easily removable, and apply no damage to the device area 10D.

As the protecting liquid L$_P$, in addition to pure water, a water solution of any organic acid that does not dissolve Cu may be used. For example, a water solution of oxalic acid, citric acid, malonic acid, or the like may be used. The concentration of the organic acid solution is preferably set as 0.001% to 5%.

Fifth Embodiment

FIGS. 14A to 14F show the steps of a Cu wiring line formation process using the damascene process, respectively, which includes an etching method and a cleaning method according to a fifth embodiment. In this process, any one of the above-explained etching/cleaning apparatuses according to the first to third embodiments is used.

In the fifth embodiment, to expand the device area 14D, the periphery of the area 10D is laterally shifted outward, thereby decreasing the width of the surface peripheral area 10E compared with the fourth embodiment. The other conditions are the same as those of the above-described fourth embodiment.

Figure 14A:
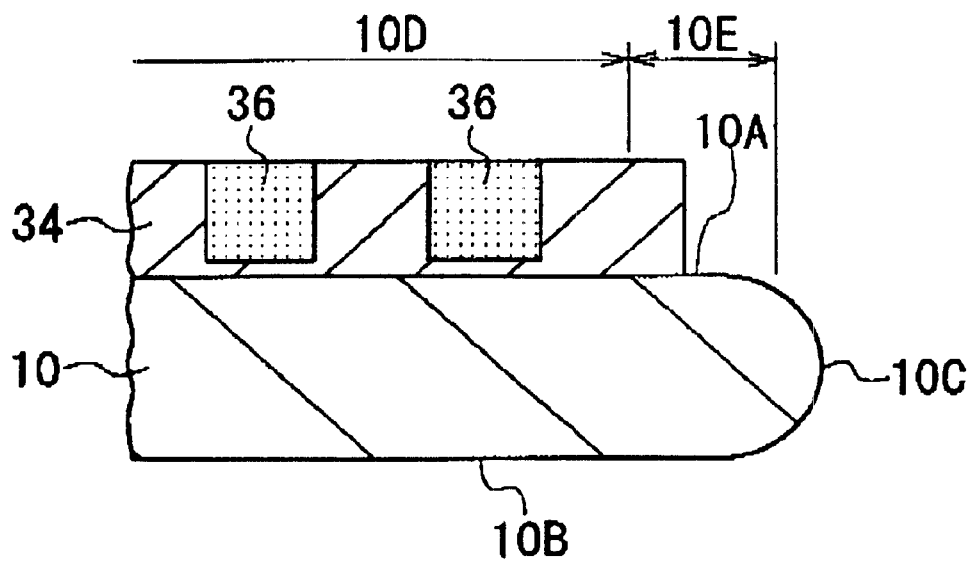
FIGS. 14A to 14F are schematic, partial cross-sectional views of a semiconductor wafer showing the formation steps of the Cu wiring lines, respectively, which includes an etching method and a cleaning method according to a fifth embodiment of the invention.

In the step S1 of FIG. 11, as shown in FIG. 14A, a SiO$_2$ film 34 is formed on the surface 10A of the Si wafer 10 by a known method. The SiO$_2$ film 34 is formed to cover the whole device area 10D and to protrude slightly from the area 10D. Thus, the periphery of the SiO$_2$ film 34 is located in the surface peripheral area 10E. In this embodiment, the width of the surface peripheral area 10E is set as approximately 2 mm.

Then, wiring trenches 36 are formed in the SiO$_2$ film 34 to be located in the device area 10D by a known method. The state at this stage is shown in FIG. 14A.

Figure 14B:
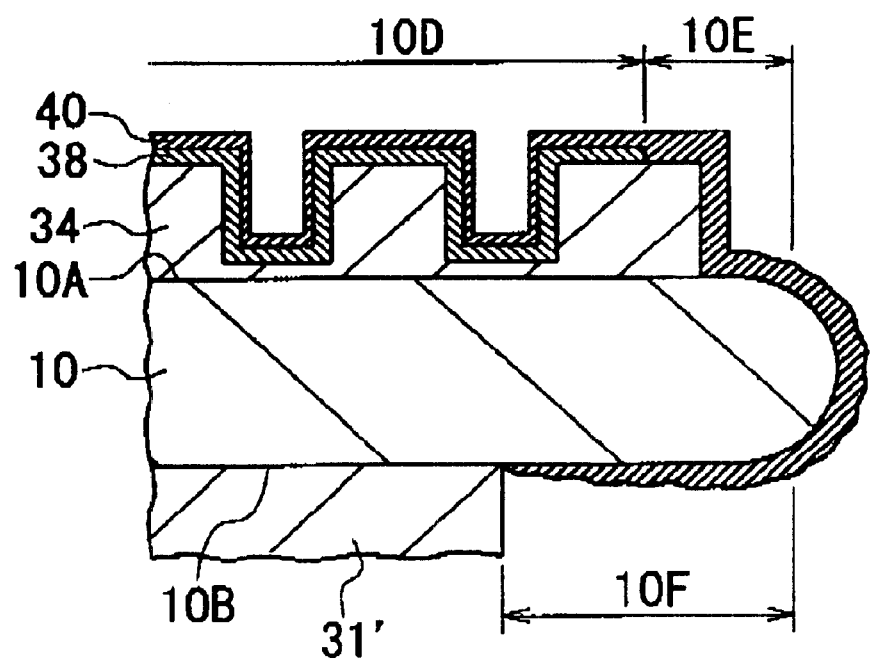

In the step S2, as shown in FIG. 14B, the wafer 10 is placed on a wafer stage 31' of a sputtering system. The stage 31' is smaller in size than the stage 31 used in the fourth embodiment. Then, a barrier metal film 38, which is made of Ta, TaN, or the like, is formed on the SiO$_2$ film 34 to cover the trenches 36 by sputtering using the shield ring 33 (not shown). Subsequently, a seed Cu film 40 is formed on the barrier metal film 38 to cover the trenches 36 by sputtering without the shield ring 33. The state at this stage is shown in FIG. 14B.

As seen from FIG. 14B, unlike the fourth embodiment, the seed Cu film 40 covers the whole end face 10C and part of the back 10B. This is because the width of the surface peripheral area 10E is very short and the shield ring 33 is not used.

In the short S3, a ring-shaped blocking member (i.e., a so-called O-ring, not shown) is placed on the seed Cu film 40, forming a space on the film 40. Then, a proper plating liquid or solution is supplied to the space to thereby form a wiring Cu film 42 on the film 40 by electroplating, as shown in FIG. 14C.

Figure 14C:
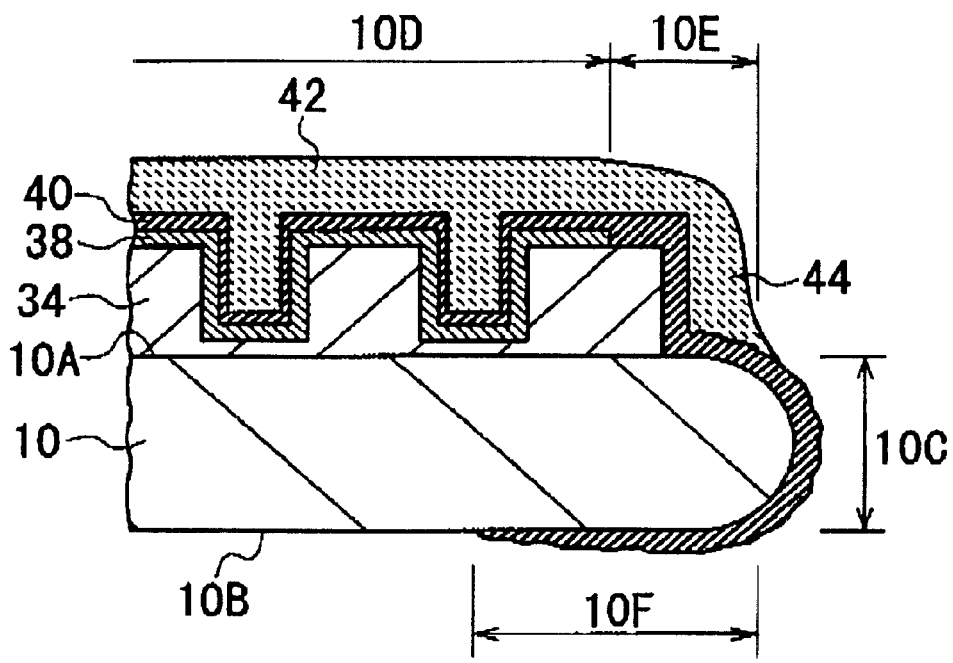

At this stage, due to the leakage of the plating liquid, an unnecessary Cu film 44 is additionally formed on the seed Cu film 40 in the peripheral area 10E, as shown in FIG. 14C. This film 44 may affect the performance of the semiconductor devices in the device area 10D and may be contaminants and as a result, it must be removed prior to the next process.

In the step S4, first, the wafer 10 is held on the wafer-holding mechanism of the above-explained etching/cleaning apparatus according to the first, second, or third embodiment and then, it is rotated in a horizontal plane.

Figure 14D:
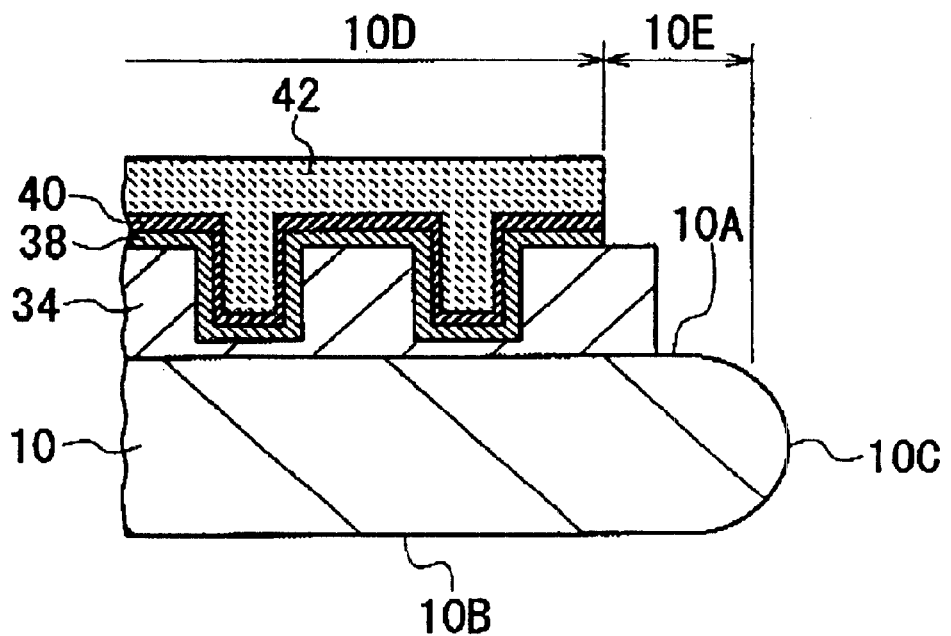

Next, pure water (i.e., the protecting liquid L$_P$) is emitted from the surface nozzle 14 toward the surface center P1 of the rotating wafer 10, covering the whole device area 10D. At the same time as this, FPM (i.e., the etching liquid L$_E$) is emitted from the edge nozzle 18 toward the edge of the water 10, covering the whole surface peripheral area 10E. Moreover, FPM is emitted from the back nozzle 16 toward the back center P2 of the wafer 10, covering the whole back 10B. Thus, the wiring Cu film 40 existing in the surface peripheral area 10E, on the end face 10C, and in the back peripheral area 10F is entirely removed and at the same time, the seed Cu film 40 located outside the device area 10D is entirely removed. The state at this stage is shown in FIG. 14D.

In the step S5, the remaining wiring Cu film 42 is annealed by a known method, thereby improving the quality of the film 42.

In the step S6, to selectively remove the wiring Cu film 42, the seed Cu film 40, and the barrier metal film 38 protruding from the trench 36 in the SiO$_2$ film 34, a CMP processing is carried out. Thus, as shown in FIG. 14E, Cu wiring lines 46 are formed in the trenches 36 and at the same time, the seed Cu film 40 and the barrier metal film 38 are left in the trenches 36.

Figure 14E:
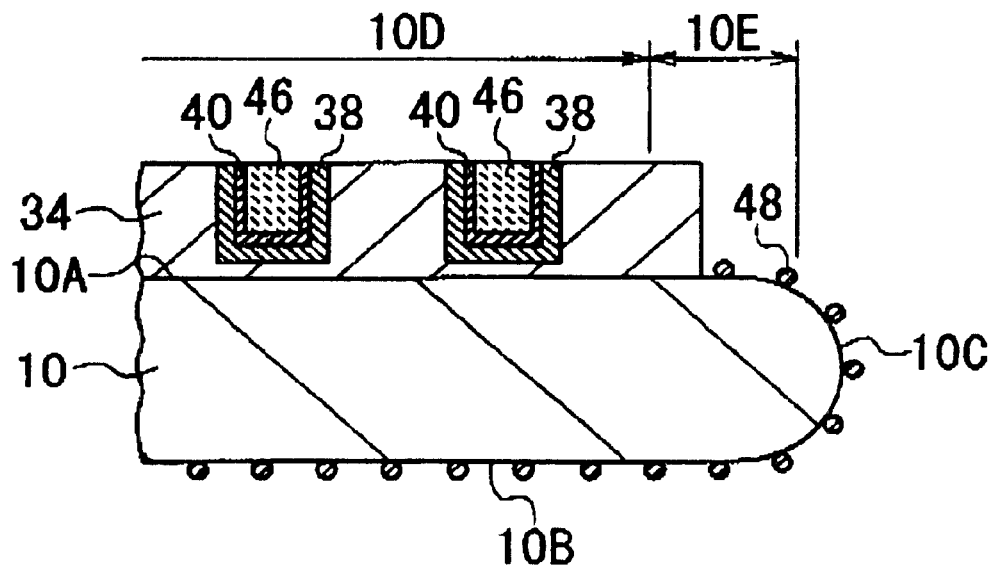

Through this CMP process, a polishing waste 48 is attached to the surface 10A in the peripheral area 10E, on the end face 10C, and the back 10B of the wafer 10, as shown in FIG. 14E. In this embodiment, the waste 48 is made of Cu and the barrier metal.

In the step S7, the polishing waste 48 is removed using the above-explained etching/cleaning apparatus according to the first, second, or third embodiment.

Specifically, first, the wafer 10 is held on the wafer-holding mechanism. Next, while the wafer 10 is rotated in a horizontal plane by the mechanism, pure water (i.e., the protecting liquid L$_P$) is emitted from the surface nozzle 14 toward the surface center P1 of the wafer 10, covering the whole device area 10D. At this time, it is preferred to remove the Cu waste 48 existing on the device area 10D by supplying temporarily a proper organic acid to the device area 10D.

At the same time as the emission of the pure water, FPM (i.e., the cleaning liquid L$_C$) is emitted from the edge nozzle 18 toward the edge of the wafer 10 to cover the whole surface peripheral area 10E while FPM is emitted from the back nozzle 16 toward the back center P2 of the wafer 10 to cover the whole back 10B.

Figure 14F:
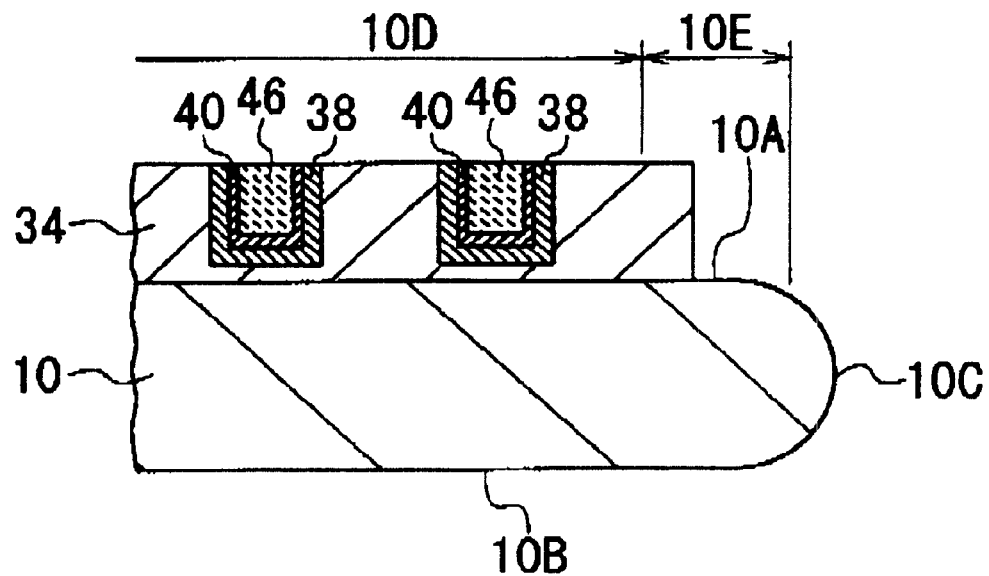

The pure water supplied to the vicinity of the surface center P1 of the wafer 10 moves outward, covering and protecting the entire device area 10D. The FPM supplied to the vicinity of the edge of the wafer 10 moves outward to be dropped therefrom, removing the polishing waste 48 existing in the surface peripheral area 10E and on the end face 10C. The FPM supplied to the vicinity of the back center P2 of the wafer 10 moves outward to be dropped therefrom, removing the polishing waste 48 existing on the back 10B. Thus, the surface peripheral area 10E, the end face 10C, and the back 10B of the wafer 10 are fully cleaned without damaging the device area 10D. The state at this stage is shown in FIG. 14F.

After the CMP process is completed, the wafer 10 may be entirely cleaned in an additional process step by immersing entirely the wafer 10 in to a cleaning solution or by brushing the wafer 10.

Sixth Embodiment

FIGS. 15A to 15F show the steps of a Cu wiring line formation process using the damascene process, respectively, which includes an etching method and a cleaning method according to a sixth embodiment. In this process, any one of the above-explained etching/cleaning apparatuses according to the first to third embodiments is used.

In the sixth embodiment, unlike the fifth embodiment, both the barrier metal film 38 and the seed Cu film 40 are formed to partially cover the back 10B of the wafer 10. Similar to the fifth embodiment, the periphery of the area 10D is shifted outward compared with the fourth embodiment, thereby expanding the device area 14D and decreasing the width of the surface peripheral area 10E.

Figure 15A:
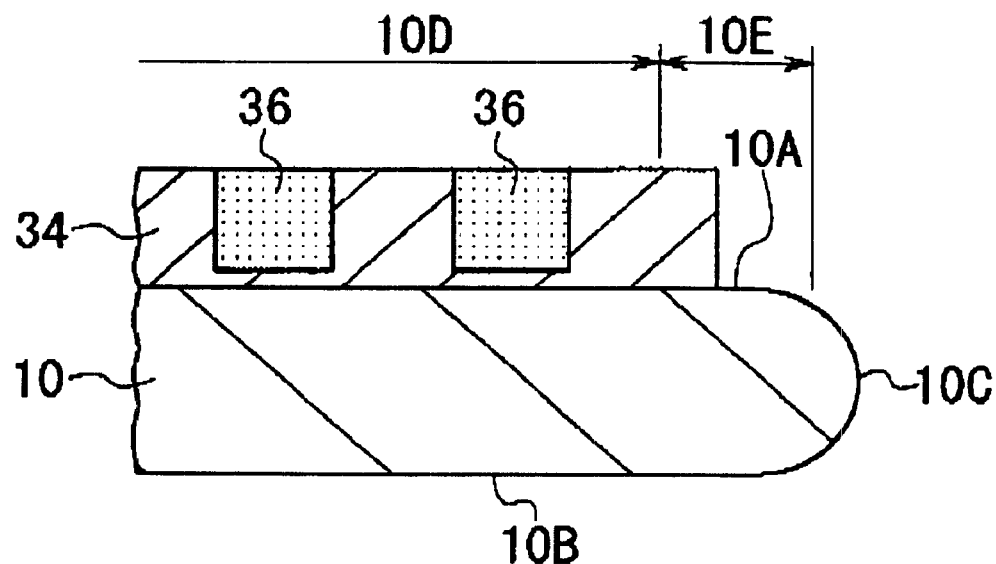
FIGS. 15A to 15F are schematic, partial cross-sectional views of a semiconductor wafer showing the formation steps of the Cu wiring lines, respectively, which includes an etching method and a cleaning method according to a sixth embodiment of the invention.

In the step S1 of FIG. 11, as shown in FIG. 15A, a $SiO_2$ film 34 is formed on the surface 10A of the Si wafer 10 by a known method. The $SiO_2$ film 34 is formed to cover the whole device area 10D and to protrude slightly from the area 10D. Thus, the periphery of the $SiO_2$ film 34 is located in the surface peripheral area 10E. In this embodiment, the width of the surface peripheral area 10E is set as approximately 2 mm.

Then, wiring trenches 36 are formed in the $SiO_2$ film 34 to be located in the device area 10D by a known method. The state at this stage is shown in FIG. 15A.

Figure 15B:
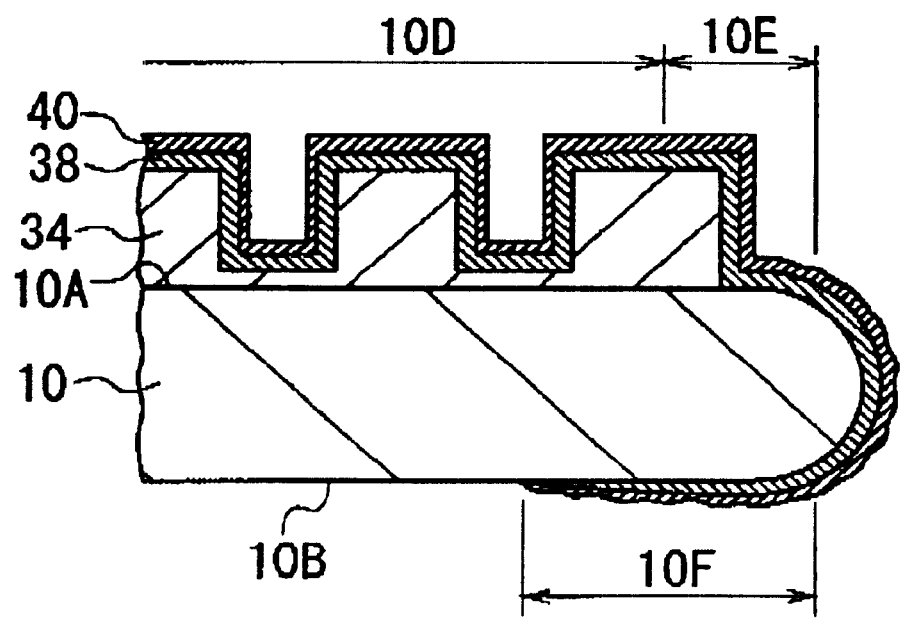

In the step S2, as shown in FIG. 15B, a barrier metal film 38, which is made of Ta, TaN, or $TaO_x$, is formed on the $SiO_2$ film 34 to cover the trenches 36 by sputtering. Subsequently, a seed Cu film 40 is formed on the barrier metal film 38 to cover the trenches 36 by sputtering. The state at this stage is shown in FIG. 15B.

As seen from FIG. 15B, both the barrier metal film 38 and the seed Cu film 40 extend to the back 10B of the wafer 10. This state may be caused by sputtering without the shield ring 33 and setting the width of the surface peripheral area 10E as very short.

Figure 15C:
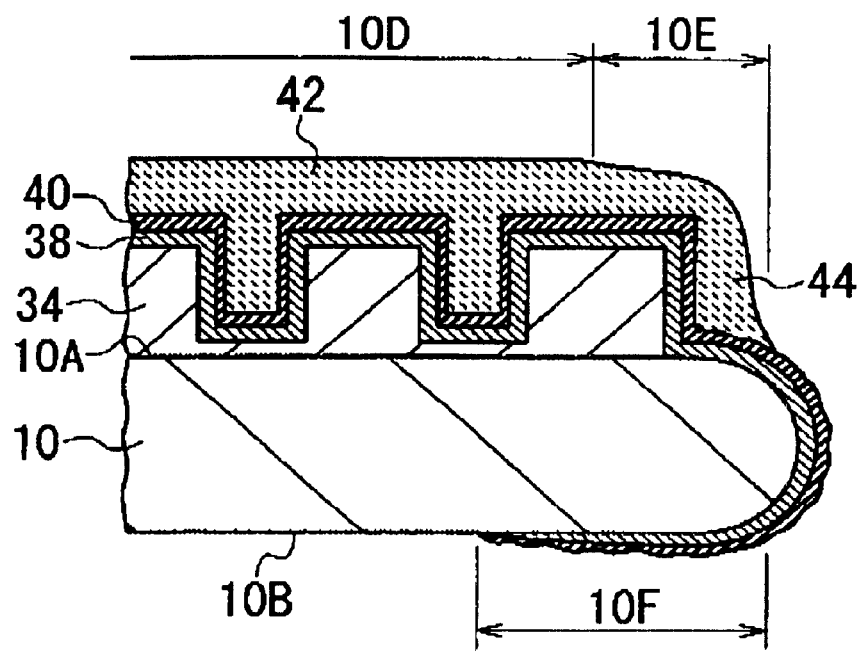

In the step S3, an O-ring (not shown) is placed on the seed Cu film 40 to form a space on the film 40. Then, a proper plating liquid or solution is supplied to the space to form a wiring Cu film 42 on the film 40 by electroplating, as shown in FIG. 15C.

At this stage, due to the leakage of the plating liquid, an unnecessary Cu film 44 is additionally formed on the seed Cu film 40 in the peripheral area 10E.

In the steps S4, using the above-explained etching/ cleaning apparatus according to the first, second, or third embodiment, the wafer 10 is rotated in a horizontal plane. Next, pure water is emitted from the surface nozzle 14 toward the surface center P1 of the rotating wafer 10, covering the whole device area 10D. At the same time as this, FPM is emitted from the edge nozzle 18 toward the edge of the wafer 10, contacting the FPM with the whole surface peripheral area 10E. Moreover, FPM is emitted from the back nozzle 16 toward the back center P2 of the wafer 10, contacting the FPM with the whole back 10B. Thus, the undesired Cu film 44 existing in the surface peripheral area 10E, on the end face 10C, and in the back peripheral area 10F is entirely removed and at the same time, the seed Cu film 40 located outside the device area 10D is entirely removed.

Figure 15D:
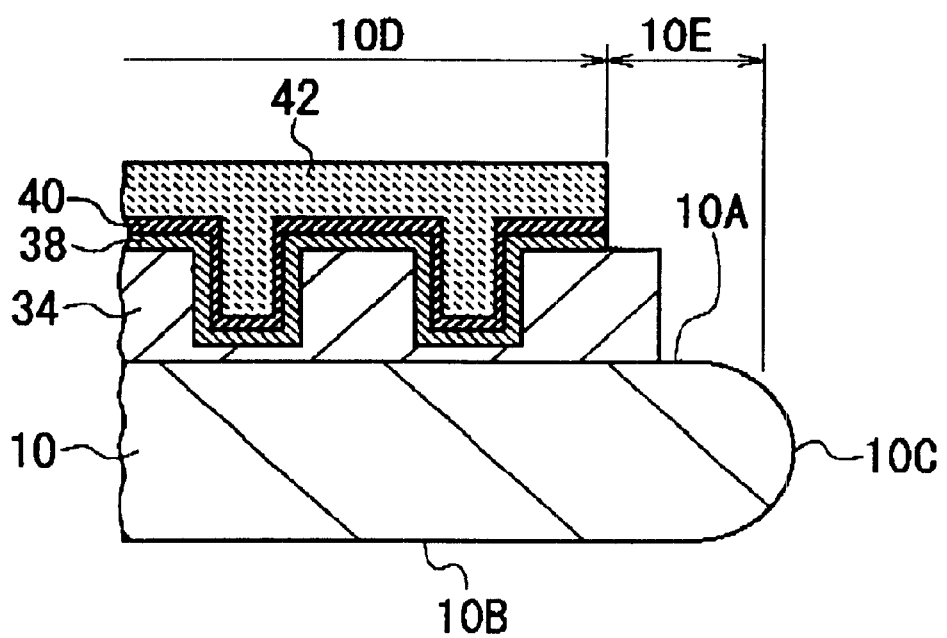

To remove the barrier metal film 38 made of Ta, TaN, or $TaO_x$, hydrofluoric acid (HF) is used instead of FPM as the etching liquid $L_E$. Subsequently, the barrier metal film 38 located outside the device area 10D is removed in the same way as that of the Cu films 40 and 44. The state at this stage is shown in FIG. 15D.

In the step S5, the remaining wiring Cu film 42 is annealed by a known method, thereby improving the quality of the film 42.

In the step S6, to selectively remove the wiring Cu film 42, the seed Cu film 40, and the barrier metal film 38 protruding from the trench 36 in the $SiO_2$ film 34, a CMP processing is carried out. Thus, as shown in FIG. 15E, Cu wiring lines 46 are formed in the trenches 36 and at the same time, the seed Cu film 40 and the barrier metal film 38 are left in the trenches 36.

Figure 15E:
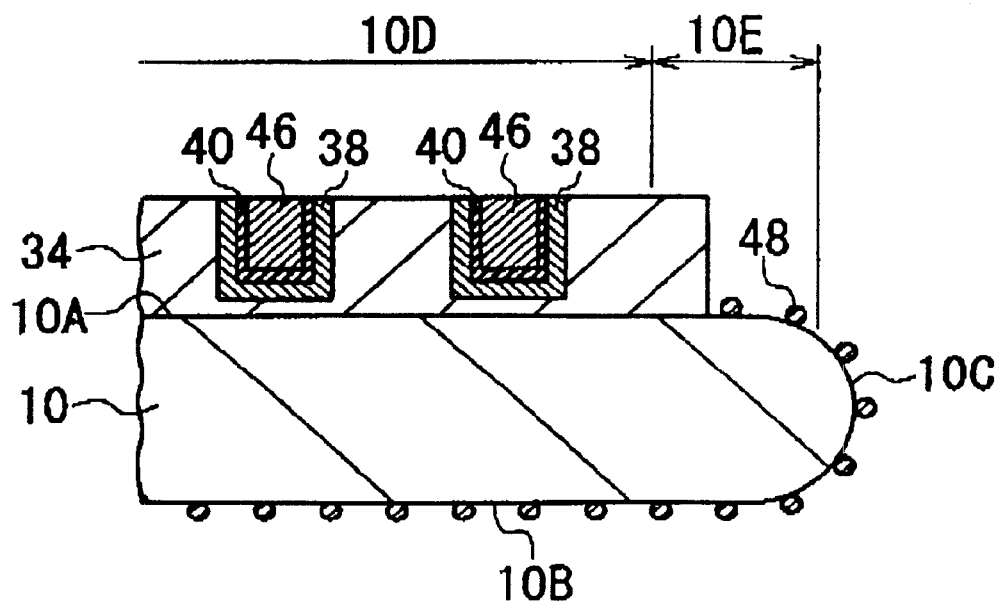

Through this CMP process, a polishing waste 48 is attached on the surface 10A in the peripheral area 10E, on the end face 10C, and on the back 10B of the wafer 10, as shown in FIG. 15E.

Figure 15F:
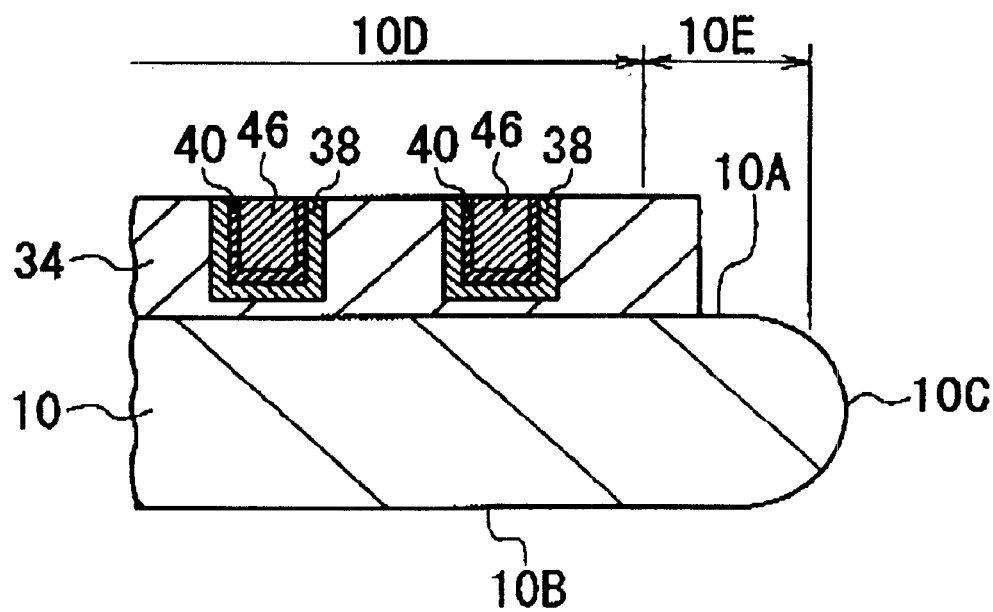

In the step S7, the polishing waste 48 is removed using the above-explained etching/cleaning apparatus according to the first, second, or third embodiment. Specifically, first, the wafer 10 is held on the wafer-holding mechanism. Next, while the wafer 10 is rotated in a horizontal plane, pure water is emitted from the surface nozzle 14 toward the surface center P1 of the wafer 10, covering the whole device area 10D. At the same time as this, FPM is emitted from the edge nozzle 18 toward the edge of the wafer 10 to be contacted with the whole surface peripheral area 10E while FPM is emitted from the back nozzle 16 toward the back center P2 of the wafer 10 to be contacted with the whole back 10B. Thus, the surface peripheral area 10E, the end face 10C, and the back 10B of the wafer 10 are fully cleaned. The state at this stage is shown in FIG. 15F.

In the above-explained fourth to sixth embodiments, the Cu wiring lines 46 are formed in the trenches 36 of the $SiO_2$ film 34. However, the present invention is not limited thereto. It can be applied to any case if at least one of the etching and cleaning processes for a semiconductor wafer is necessary. For example, the invention may be applied to the case where metal wiring lines or metal electrodes made of Pt, Ir, IrO, or the like, are formed on a dielectric film. Also, the invention may be applied to the case where a ferroelectric film made of BST, PZT, or the like, is formed on another film.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An etching method comprising the steps of:
    (a) rotating a semiconductor wafer in a horizontal plane;
        said wafer having a device area, an end face and a surface peripheral area on its surface;
        said surface peripheral area being located outside said device area and between the device area and the end face; and
    (b) emitting an etching liquid toward a surface peripheral area of said wafer by an edge nozzle and controlling the etching liquid through the least one of wafer rotation speed or liquid emission rate, so that the etching liquid selectively contacts the surface peripheral area and the end face of the wafer without contacting the device area, thereby selectively etching out an unnecessary material existing in said surface peripheral area, wherein a protecting liquid is emitted toward a surface center of said wafer by a surface nozzle, thereby covering said device area of said wafer to protect the same against said etching liquid emitted from said edge nozzle.

2. The method according to claim 1, wherein pure water or a water solution of organic acid is used as said protecting liquid.

3. The method according to claim 2, wherein said water solution of organic acid is a water solution of one selected from the group consisting of oxalic acid, citric acid, and malonic acid;

and wherein said solution of organic acid has a concentration of 0.001% to 5%.

4. An etching method comprising the steps of:
(a) rotating a semiconductor wafer in a horizontal plane; said wafer having a device area, an end face and a surface peripheral area on its surface;
said surface peripheral area being located outside said device area and between the device area and the end face; and
(b) emitting an etching liquid toward a surface peripheral area of said wafer by an edge nozzle and controlling the etching liquid through at least one of water rotation speed or liquid emission rate, so that the etching liquid selectively contacts the surface peripheral area and the end face of the wafer without contacting the device area, thereby selectively etching out an unnecessary material existing in said surface peripheral area,
wherein an etching liquid is emitted toward a back center of said wafer by a back nozzle, thereby etching out an unnecessary material existing on a back of said wafer, and a protecting liquid is emitted toward a surface center of said wafer by a surface nozzle, thereby covering said device area of said wafer to protect the same against said etching liquid emitted from said edge nozzle.

5. A cleaning method comprising the steps of:
(a) rotating a semiconductor wafer in a horizontal plane; said wafer having a device area, an end face and a surface peripheral area on its surface;
said surface area peripheral area being located outside said device area and between the device area and the end face; and
(b) emitting a cleaning liquid toward a surface peripheral area of said wafer by an edge nozzle and controlling the etching liquid through wafer rotation speed, so that the etching liquid selectively contacts the surface peripheral area and the end face of the wafer without contacting the device area, thereby selectively removing an unnecessary material existing in said surface peripheral area
wherein a protecting liquid is emitted toward a surface center of said wafer by a surface nozzle, thereby covering said device area of said wafer to protect the same against said cleaning liquid emitted from said edge nozzle.

6. The method according to claim 5, wherein pure water or a water solution of organic acid is used as said protecting liquid.

7. The method according to claim 6, wherein said water solution of organic acid is water solution of one selected from the group consisting of oxalic acid, citric acid, and malonic acid;

and wherein said solution of organic acid has a concentration of 0.001% to 5%.

8. A cleaning method comprising the steps of:
(a) rotating a semiconductor wafer in a horizontal plane; said wafer having a device area, an end face and a surface peripheral area on its surface;
said surface area peripheral area being located outside and device area and between the device area and the end face; and
(b) emitting a cleaning liquid toward a surface peripheral area of said wafer by an edge nozzle and controlling the etching liquid through wafer rotation speed, so that the etching liquid selectively contacts the surface peripheral area and the end face of the wafer without contacting the device area, thereby selectively removing an unnecessary material existing in said surface peripheral area,
wherein a cleaning liquid is emitted toward a back center of said wafer by a back nozzle, thereby etching out an unnecessary material existing on a back of said wafer, and a protecting liquid is emitted toward a surface center of said wafer by a surface nozzle, thereby covering said device area of said wafer to protect the same against said cleaning liquid emitted from said edge nozzle.

9. An etching method comprising the steps of:
(a) rotating a semiconductor wafer in a horizontal plane; said wafer having a device area, an end face and a surface peripheral area on its surface;
said surface peripheral area being located outside said device area and between the device area and the end face; and
(b) emitting an etching liquid toward a surface peripheral area of said wafer by an edge nozzle and controlling the etching liquid so that the etching liquid selectively contacts the surface peripheral area and the end face of the wafer without contacting the device area, thereby selectively etching out an unnecessary material existing in said surface peripheral area; and
(c) emitting a protecting liquid toward a surface center of said wafer by a surface nozzle, thereby covering said device area of said wafer to protect the same against said etching liquid emitted from said edge nozzle;
wherein said unnecessary material existing in said surface peripheral area of said wafer is selectively removed while protecting said device area of said wafer against said etching liquid.

10. The method according to claim 6, wherein said etching liquid emitted from said edge nozzle has an emission direction oriented along a rotation direction of said wafer or outward with respect to a tangent of said wafer formed near a contact point of said liquid with said surface peripheral area of said wafer.

11. The method according to claim 9, wherein an etching liquid is emitted toward a back center of said wafer by a back nozzle, thereby etching out an unnecessary material existing on a back of said wafer.

12. The method according to claim 9, wherein said etching liquid emitted from said edge nozzle is beam-shaped.

13. The method according to claim 9, wherein an acid or an alkali solution containing $H_2O_2$ is used as said etching liquid.

14. The method according to claim 9, wherein said unnecessary material is Cu;

and wherein said etching liquid is one selected from the group consisting of FPM ($HF/H_2O_2/H_2O$), SPM ($H_2SO_4/H_2O_2/H_2O$), HPM ($HCl/H_2O_2/H_2O$), water solution of nitric hydrogen peroxide ($HNO_3/H_2O_2/H_2O$), APM ($NH_4OH/H_2O_2/H_2O$), and thick nitric acid ($HNO_3$).

15. The method according to claim 14, wherein a $SiO_2$ film is formed on or over said surface of said wafer;

and wherein etching liquid has a composition of
$HF:H_2O_2:H_2O=1-10:1-20:100$
$H_2SO_4:H_2O_2:H_2O=1-10:1-20:100$
$HCl:H_2O_2:H_2O=1-10:1-20:100$
$HNO_3:H_2O_2:H_2O=1-10:1-20:100$
$NH_4OH:H_2O_2:H_2O=1-10:1-20:100$
$HNO_3=30\%-80\%$.

16. The method according to 14, wherein a $SiO_2$ film is formed on or over said surface of said wafer;

and wherein etching liquid is FPM having a composition of $HF:H_2O_2:H_2O=1:10:100$.

17. The method according to claim 9, wherein pure water or a water solution of organic acid is used as said protecting liquid.

18. The method according to claim 17, wherein said wafer solution of organic acid is a water solution of one selected from the group consisting of oxalic acid, citric acid, and malonic acid.

19. The method according to claim 9, wherein said unnecessary material is Ta, TaN, or $TaO_x$;

and wherein hydrofluoric acid (HF) is used as said etching liquid.

20. The method according to claim 9, wherein said edge nozzle is located on the side of said surface peripheral area of said wafer.

21. A cleaning method comprising the steps of:

(a) rotating a semiconductor wafer in horizontal plane;
    said wafer having a device area, an end face and a surface peripheral area on its surface;
    said surface peripheral area being located outside said device area and between the device area and the end face; and (b) emitting a cleaning liquid toward a surface peripheral area of said water by an edge nozzle, and controlling the etching liquid so that the etching liquid selectively contacts the surface peripheral area and the end face of the wafer without contacting the device area, thereby selectively removing an unnecessary material existing in said surface peripheral area; and (c) emitting a protecting liquid toward a surface center of said water by a surface nozzle, thereby covering said device area of said wafer to protect the same against said cleaning liquid emitting from said edge nozzle;
    wherein said unnecessary material existing in said surface peripheral area of said wafer is selectively removed while protecting said device area of said wafer against said etching liquid.

22. The method according to claim 21, wherein said cleaning liquid emitted from said edge nozzle has an emission direction oriented along a rotation direction of said water or outward with respect to a tangent of said wafer formed near a contact point of said liquid with said surface peripheral area of said wafer.

23. The method according to claim 21, wherein an cleaning liquid is emitted toward a back center of said wafer by a back nozzle, thereby etching out an unnecessary material existing on a back of said wafer.

24. The method according to claim 21, wherein said cleaning liquid emitted from said edge nozzle is beam-shaped.

25. The method according to claim 21, wherein an acid or an alkali solution containing $H_2O_2$ is used as said cleaning liquid.

26. The method according to claim 21, wherein said unnecessary material is Cu;

and wherein said cleaning liquid is one selected from the group consisting of FPM ($HF/H_2O_2/H_2O$), SPM ($H_2SO_4/H_2O_2/H_2O$), HPM ($HCl/H_2O_2/H_2O$), water solution of nitric hydrogen peroxide ($HNO_3/H_2O_2/H_2O$), APM ($NH_4OH/H_2O_2/H_2O$), and thick nitric acid ($HNO_3$).

27. The method according to claim 21, wherein pure water or a water solution of organic acid is used as said protecting liquid.

28. The new method according to claim 27, wherein said wafer solution of organic acid is a water soluble of one selected from the group consisting of oxalic acid, citric acid, and malonic acid;

and wherein said solution of organic acid has a concentration of 0.001% to 5%.

* * * * *